(12) United States Patent
Asano et al.

(10) Patent No.: US 7,977,131 B2
(45) Date of Patent: Jul. 12, 2011

(54) METHOD FOR MANUFACTURING NANO-ARRAY ELECTRODE AND PHOTOELECTRIC CONVERSION DEVICE USING SAME

(75) Inventors: Tsuyoshi Asano, Yokohama (JP); Takaya Kubo, Yokohama (JP); Yoshinori Nishikitani, Yokohama (JP)

(73) Assignee: Nippon Oil Corporation, Tokyo (JP)

( * ) Notice: Subject to any disclaimer, the term of this patent is extended or adjusted under 35 U.S.C. 154(b) by 16 days.

(21) Appl. No.: 12/643,298

(22) Filed: Dec. 21, 2009

(65) Prior Publication Data

US 2010/0132772 A1    Jun. 3, 2010

Related U.S. Application Data

(60) Division of application No. 11/424,242, filed on Jun. 15, 2006, now abandoned, which is a continuation of application No. PCT/JP2004/016471, filed on Oct. 29, 2004.

(30) Foreign Application Priority Data

Dec. 18, 2003  (JP) .................................. 2003-421625

(51) Int. Cl.
    *H01L 21/66*    (2006.01)
(52) U.S. Cl. .......... 438/41; 438/100; 438/131; 438/151; 438/688; 438/689; 257/14; 257/72; 257/192; 257/226; 257/296; 257/E21.327
(58) Field of Classification Search .......................... None
    See application file for complete search history.

(56) References Cited

U.S. PATENT DOCUMENTS

| | | | |
|---|---|---|---|
| 5,331,183 | A | 7/1994 | Sariciftci et al. |
| 5,454,880 | A | 10/1995 | Sariciftci et al. |
| 5,581,091 | A | 12/1996 | Moskovits et al. |
| 6,129,901 | A | 10/2000 | Moskovits et al. |
| 6,228,241 | B1 | 5/2001 | Alwitt et al. |
| 6,231,744 | B1 | 5/2001 | Ying et al. |
| 6,855,025 | B2 | 2/2005 | Iwasaki et al. |
| 7,291,782 | B2 * | 11/2007 | Sager et al. ................... 136/250 |

(Continued)

FOREIGN PATENT DOCUMENTS

EP    1020545 A2    7/2000

(Continued)

OTHER PUBLICATIONS

Y. Moriya et al., "Preparation of TiO2 Hole Array by Replication Process", The Electrochemical Society of Japan Dai 68 Kai Taikai Koen Yoshishu, pp. 121, Koen Bango 3G18, (2001).

(Continued)

*Primary Examiner* — N Drew Richards
*Assistant Examiner* — Kyoung Lee
(74) *Attorney, Agent, or Firm* — Panitch Schwarze Belisario & Nadel LLP

(57) ABSTRACT

The present invention provides a method of manufacturing a nano-array electrode with a controlled nano-structure by filling a compound having an electron-accepting structure or an electron donating structure into the fine pores of an anodic-oxide porous alumina film obtained by anodically oxidizing aluminum in electrolyte. The spaces defined between the nano-arrays formed of the compound by removing the alumina film are filled with a compound having an electron-donating structure if the nano-arrays have an electron-accepting structure and a compound having an electron-accepting structure if the nano-arrays have an electron-donating structure. A high-performance, high-efficiency photoelectric converting device comprising a nano-array electrode manufactured by the method is also disclosed.

2 Claims, 5 Drawing Sheets

U.S. PATENT DOCUMENTS

| | | | |
|---|---|---|---|
| 2002/0014621 | A1 | 2/2002 | Den et al. |
| 2002/0034662 | A1 | 3/2002 | Den |
| 2002/0096107 | A1 | 7/2002 | Fujishima et al. |
| 2002/0108560 | A1 | 8/2002 | Fujishima et al. |
| 2003/0186514 | A1* | 10/2003 | Imada et al. ............ 438/466 |

FOREIGN PATENT DOCUMENTS

| | | |
|---|---|---|
| EP | 1020545 A3 | 3/2006 |
| JP | 2001328896 A | 11/2001 |
| JP | 2003073859 A | 3/2003 |

OTHER PUBLICATIONS

H. Masuda, "Anode Sanka ni Motozuku Kisokusei Porous Alumina no Sakusei to Denkyoku eno Oyo", Electrochemistry, vol. 69, No. 11, pp. 879-883, (2001).

H. Masuda et al., "Fabrication of Carbon Nanotube with Triangular Opening", The Electrochemical Society of Japan Dai 68 Kai Taikai Koen Yoshishu, pp. 408, Koen Bango 1S04, (2001).

B. O'Regan et al.; "A low-cost, high-efficiency solar cell based on dye-sensitized colloidal TiO2 films", Nature, vol. 353, pp. 737-740, (1991).

M. Wong et al., "Supramolecular Templating of Thermally Stable Crystalline Mesoporous Metal Oxides Using nanoparticulate Precursors", Nano Letters, vol. 1, pp. 637-647, (2001).

H. Fujii et al., "Synthesis and Photocatalytic Activity of Lamellar Titanium Oxide Formed by Surfactant Bilayer Templating", Journal of American Chemical Society, vol. 120, pp. 6832-6833, (1998).

M. Yata et al., "Rare Earth (Er, Tm, Yb, Lu) Oxide Nanotubes Templated by Dodecylsulfate Assemblies", Advanced Materials, vol. 14, pp. 309-313, (2002).

N. Ulagappan et al., "Mesoporous phases based on SnO2 and TiO2", Chemical Communications, pp. 1685-1686, (1996).

W. Zhao et al.; "Synthesis and Characterization of Mesoporous Titanium Dioxide", Chinese Journal of Catalysis, vol. 20, pp. 375-377, (1999).

D.M. Antonelli, "Synthesis of phosphorus-free mesoporous titania via templating with amine surfactants", Microporous and Mesoporous Materials, vol. 30, pp. 315-319, (1999).

H. Imai et al., "Direct preparation of anatase TiO2 nanotubes in porous aluminia membranes", Journal of Materials Chemistry, vol. 9, pp. 2971-2972, (1999).

J. Zhao et al., "Preparation of multi-walled carbon nanotube array electrodes and its electrochemical intercalation behavior of Li ions", Chemical Physics letters, No. 358, pp. 77-82, (2002).

D. Routkevitch et al., "Nonlithographic Nano-Wire Arrays: Fabrication, Physics, and Device Applications", IEEE Transactions on Electron Devices, vol. 43, No. 10, pp. 1646-1658, Oct. 1996.

International Search Report for counterpart International Patent Application No. PCT/JP2004/016471; dated Dec. 21, 2004.

Written Opinion for counterpart International Patent Application No. PCT/JP2004/016471.

* cited by examiner

Electron-donating phase or electron accepting phase

Electron-accepting phase or electron-donating phase

Electron-donating phase or electron accepting phase

Electron-accepting phase or electron-donating phase

Electron-donating phase or electron accepting phase

Electron-accepting phase or electron-donating phase

METHOD FOR MANUFACTURING NANO-ARRAY ELECTRODE AND PHOTOELECTRIC CONVERSION DEVICE USING SAME

CROSS-REFERENCE TO RELATED APPLICATIONS

This application is a divisional of co-pending U.S. patent application Ser. No. 11/424,242, filed Jun. 15, 2006, w is a continuation of International Application No. PCT/JP2004/016471, filed Oct. 29, 2004, which was published in the Japanese language on Jul. 7, 2005, under International Publication No. WO 2005/061762 A1 and the disclosure of which is incorporated herein by reference.

BACKGROUND OF THE INVENTION

The present invention relates to novel nano-array electrodes with a controlled nano-structure and photoelectric conversion devices using the same.

Conventional electrooptic devices and photoelectrochemical devices usually contain functional electrodes wherein a semiconductor is formed as a film on a substrate with an electrically conductive film. The semiconductor is responsive to external factors such as heat, light and temperature changes and produces electrons, phonons, or complexes thereof depending on the environment. When these electrons, phonons, or complexes thereof propagate through a semiconductor layer which is formed of aggregated semiconductor fine particles, scattering of the fine particles therein causes the deactivation of their elementary excitation state, which will be a problem when the performance of a functional device is intended to be improved. Therefore, it is important to suppress the scattering of the fine particles in the agglomerate thereof.

For example, the most commonly used semiconductor material for dye-sensitized solar cells is titanium oxide (see, for example, Document 1 given below). The solar cells includes functional electrodes formed by forming a film of titanium oxide particles a few tens of nanometers in size on a transparent electrically conductive substrate and allowing a dye to adsorb thereon. It has been reported that the photo-conversion efficiency of this functional electrode depends largely on the structure of the titanium oxide layer such as the shape of titanium oxide particles and the bonding state thereof. The portions wherein titanium oxide particles bond to each other form barriers to the passage of photo-generated electrons through the titanium oxide layer to the transparent electrically conductive substrate. Due to the formation of the barriers, sufficient advantageous effects to enhance the solar energy conversion efficiency have not been able to be obtained even though the titanium oxide layer is thickened and a larger amount of dye is adsorbed thereto. In order to enhance the solar energy conversion efficiency, it has been attempted to control the structure of titanium oxide particles forming the titanium oxide layer (see, for example, Documents 2 to 8). However, it is difficult to accurately control the structure of particles, and at the same time an issue concerning the enhancement of the productivity also arises.

For enhancing the efficiency of an organic film type solar cell, it is necessary to establish a combination of an electron-donating organic semiconductor (donor) and an electron-accepting organic semiconductor (acceptor), a so-called heterojunction structure. An effective charge separation occurs in the proximity of the interface between the donor and the acceptor. Based on such an idea, Patent Documents 1 and 2 below proposed the use of a so-called bulk heterojunction wherein an electric conductive polymer as a donor and a fullerene derivative as an acceptor are mixed, thereby successfully developing a device with higher photoelectric converting efficiency than the conventional layered structure devices. In order to further enhance the efficiency, it is necessary to precisely control the interface structure between the donor and acceptor. However, there is a problem that it is difficult to control the structure by the mere mixing of the donor and acceptor.

Patent Document 1: U.S. Pat. No. 5,454,880
Patent Document 2: U.S. Pat. No. 5,331,183
Non-Patent Document 1: "NATURE" (Great Britain) 1991, VOL. 353, page 737 by B. O'Regan and M. Gratzel
Non-Patent Document 2: "Nano Letters" (U.S.A.) 2001, VOL. 1, page 637 by M. S. Won, Esther S. Jeng, and Jackie Y. Ying
Non-Patent Document 3: "Journal of American Chemical Society" (U.S.A.) 1998, VOL. 120, page 6832 by M. Ohtaki et al.
Non-Patent Document 4: "Advanced Materials" (U.S.A.) 2002, VOL. 14, page 309 by M. Yata, M. Mihara, S. Mouri, M. Kuroki, and T. Kijima
Non-Patent Document 5: "Chemical Communications" (Great Britain) 1996, page 1685 by N. Ulagappan and C. N. R. Rao
Non-Patent Document 6: "Chinese Journal of Catalysis" (China) 1999, VOL. 20, page 375 by W. Zhao, Y. Sun, Q. Ma, and Y. Fang
Non-Patent Document 7: "Microporus and Mesoporous Materials" (U.S.A.) 1999, VOL. 30, page 315 by D. M. Antonelli
Non-Patent Document 8: "Journal of Materials Chemistry" (Great Britain) 1999, VOL. 9, page 2971 by H. Imai, Yuko Takei, Kazuhiko Shimizu, Manabu Matsuda, and Hiroshi Hirashima

BRIEF SUMMARY OF THE INVENTION

The present invention was achieved in view of the foregoing situations and has an object to provide a method of manufacturing a novel nano-array electrode with a controlled nano structure and a high performance and efficient photoelectric conversion device comprising the nano-array electrode.

That is, the present invention relates to a method of manufacturing a nano-array electrode wherein an electrode material is filled into the fine pores of an anodic-oxide porous alumina film obtained by anodically oxidizing aluminum in electrolyte.

The present invention also relates to a method of manufacturing a nano-array electrode wherein after a material is filled into the fine pores of an anodic-oxide porous alumina film obtained by anodically oxidizing aluminum in electrolyte, an electrode material is filled into the spaces defined between the nano-arrays by removing the anodic-oxide porous alumina film.

Furthermore, the present invention also relates to a method of manufacturing a nano-array electrode wherein an electrode material is repeatedly filled into the fine pores of an anodic-oxide porous alumina film obtained by anodically oxidizing aluminum in electrolyte so as to fill a plurality of electrode materials thereinto.

Still furthermore, the present invention also relates to a method of manufacturing a nano-array electrode wherein after a compound having an electron-accepting structure or an electron-donating structure is filled into the fine pores of an anodic-oxide porous alumina film obtained by anodically oxidizing aluminum in electrolyte, the spaces defined between the nano-arrays formed of the compound by removing the anodic-oxide porous alumina film are filled with a compound having an electron-donating structure if the nano-arrays have an electron-accepting structure and a compound having an electron-accepting structure if the nano-arrays have an electron-donating structure.

Still furthermore, the present invention relates to a photoelectric converting device comprising the nano-array electrode manufactured by any of the foregoing methods.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
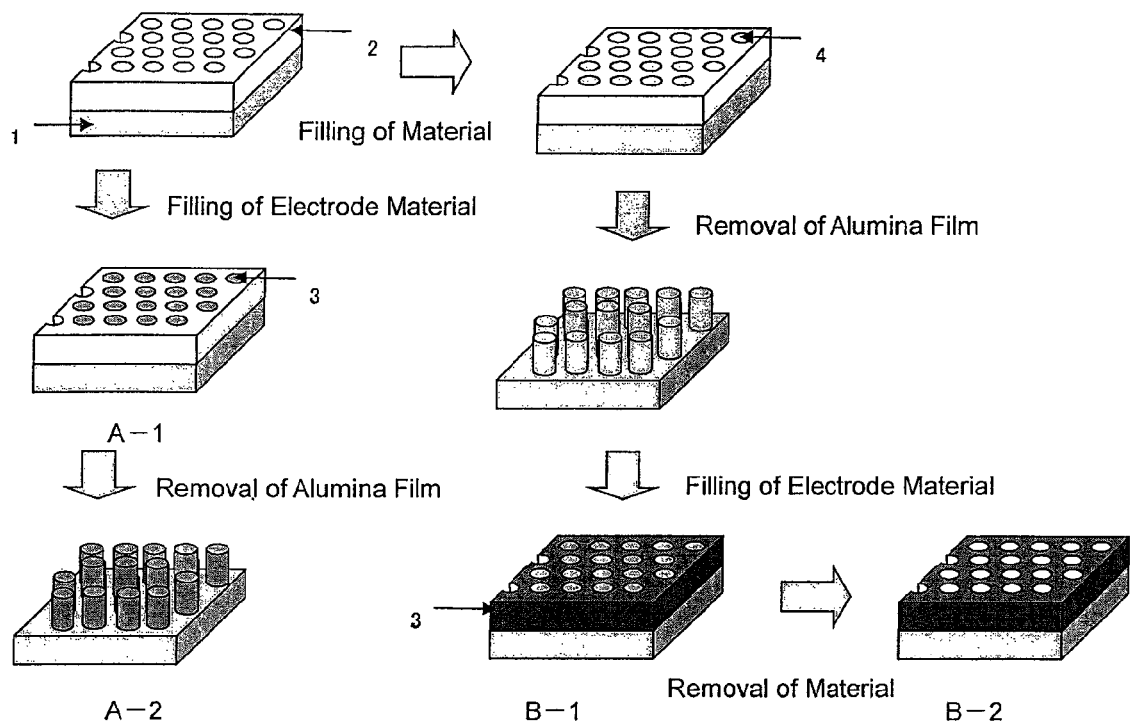
FIG. 1 is a schematic view for illustrating the manufacture of a nano-array electrode.

The present invention will be described in more detail below.

The nano-array electrode of the present invention is characterized in that it is manufactured using an anodic-oxide porous alumina film obtained by anodically oxidizing aluminum in electrolyte, as a mold. There is no particular restriction on the type of aluminum to be anodically oxidized as long as it contains aluminum. Examples of aluminum include aluminum metals and aluminum alloys of aluminum and metals such as chromium, nickel, iron, silicon, copper, manganese, magnesium, zinc, and titanium. There is no particular restriction on the shape of aluminum. Examples of the shape include plate and foil. Alternatively, any of the materials containing aluminum may be laminated on a substrate such as glass.

There is no particular restriction on the substrate. The transparency, material, thickness, size, and shape of the substrate can be properly selected depending on the purposes. For example, the substrate may be selected from colorless or colored glasses, wire glasses, glass blocks, wood, and stone. Alternatively, the substrate may be a colored or colorless transparent resin. Specific examples of such a resin include polyesters such as polyethylene terephthalate, polyamides, polysulfones, polyethersulfones, polyether ketones, polyphenylene sulfides, polycarbonates, polyimides, polymethyl methacrylates, polystyrenes, cellulose triacetates, and polymethyl pentenes. The term "transparent" used herein denotes a transmissivity of 10 to 100 percent, preferably 50 percent or greater.

Alternatively, the substrate may be provided with electric conductivity by forming thereon an electrode layer. There is no particular restriction on the electrode layer. For example, the electrode layer may be a metal film of gold, silver, chromium, copper, or tungsten or an electrically conductive film of a metal oxide. Preferred examples of the metal oxide include those obtained by doping to a metal oxide of tin or zinc a trace amount of a different metal element, such as Indium Tin Oxide (ITO ($In_2O_3$:Sn)), Fluorine doped Tin Oxide (FTO ($SnO_2$:F)), Aluminum doped Zinc Oxide (AZO (ZnO:Al)), and Indium doped Zinc Oxide (IZO (ZnO:In)).

There is no particular restriction on the film thickness of the electrode layer. However, it is usually from 50 to 5000 nm and preferably from 100 to 3000 nm. There is no particular restriction on the surface resistance (resistivity). However, it is usually from 0.5 to 500 Ω/sq, preferably from 2 to 50 Ω/sq.

There is no particular restriction on the method of forming the electrode layer. The method is properly selected from any conventional methods depending on the type of the above-described metal or metal oxide used as the electrode layer. In general, the method is selected from vacuum film forming methods such as vacuum deposition, ion plating, CVD, and sputtering and wet film forming methods such as electrocrystallization, electrophoresis, electrolytic plating, and electroless plating. When any of the vacuum film forming methods is employed, the electrode layer is desirously formed at a substrate temperature of 20 to 700° C. When any of the wet film forming methods is employed, the electrode layer is desirously formed at a substrate temperature of −20 to 300° C.

There is no particular restriction on the electrolyte to be used for anodic oxidization as long as it is capable of dissolving alumina generated by anodic oxidization of aluminum. Therefore, the electrolyte may be an acid aqueous solution, an alkali aqueous solution or a non-aqueous electrolyte.

There is no particular restriction on the acid aqueous solution as long as it is acidic enough to dissolve alumina generated by anodic oxidization of aluminum. Examples of the acid aqueous solution include various types of aqueous solutions of sulfuric acid, oxalic acid, phosphoric acid, boric acid, nitric acid, acetic acid, or a mixture thereof. The pH of the acid aqueous solution is from 0.01 to 5, preferably from 0.1 to 3.

There is no particular restriction on the alkali aqueous solution as long as it is alkaline enough to dissolve alumina generated by anodic oxidization of aluminum. Examples of the alkali aqueous solution include various types of aqueous solutions of sodium hydroxide, potassium hydroxide, calcium hydroxide, lithium hydroxide, magnesium hydroxide, lithium carbonate, sodium carbonate, potassium carbonate, calcium carbonate, magnesium carbonate, lithium hydrogen carbonate, sodium hydrogen carbonate, potassium hydrogen carbonate, calcium hydrogen carbonate, magnesium hydrogen carbonate, or a mixture thereof. The pH of the alkali aqueous solution is from 8 to 14, preferably from 9 to 13.

The non-aqueous electrolyte may be any of solvents which are generally used for electrochemical cells or electric cells. Specific examples of the non-aqueous electrolyte include acetic anhydride, methanol, ethanol, tetrahydrofuran, propylene carbonate, nitromethane, acetonitrile, dimethylformamide, dimethylsulfoxide, hexamethylphosphoamide, ethylene carbonate, dimethoxyethane, γ-butyrolactone, γ-valerolactone, sulfolane, propionnitrile, glutaronitrile, adiponitrile, methoxyacetonitrile, methoxypropionitrile, dimethylacetoamide, methylpyrrolidinone, dioxolane, trimethyl phosphate, triethyl phosphate, tripropyl phosphate, ethyldimethyl phosphate, tributyl phosphate, tripentyl phosphate, trihexyl phosphate, triheptyl phosphate, trioctyl phosphate, trinonyl phosphate, tridecyl phosphate, tris(trifluoromethyl) phosphate, tris(pentafluoroethyl)phosphate, triphenylpolyethylene glycol phosphate, and polyethylene glycol. Particularly preferred examples include propylene carbonate, ethylene carbonate, dimethylsulfoxide, dimethoxyethane, acetonitrile, γ-butyrolactone, sulfolane, dioxolane, dimethylformamide, tetrahydrofuran, adiponitrile, methoxyacetonitrile, methoxypropionitrile, dimethylacetoamide, methylpyrrolidinone, trimethyl phosphate, and triethyl phosphate.

Alternatively, an ordinary-temperature melting salt may be used as the electrolyte. The term "ordinary-temperature melting salt" used herein denotes a salt comprising an ion pair in a melted state (liquid state) at ordinary temperature, more specifically a salt comprising an ion pair whose melting point is 20° C. or below and will be in a liquid state at a temperature exceeding 20° C. Examples of the ordinary-temperature melting salt include those represented by the following formulas:

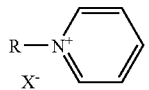

wherein R is an alkyl group having 2 to 20, preferably 2 to 10 carbon atoms and $X^-$ is a halogen ion or $SCN^-$;

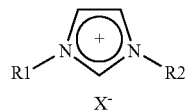

wherein R1 and R2 are each independently an alkyl group having 1 to 10 carbon atoms, preferably methyl or ethyl or an aralkyl group having 7 to 20, preferably 7 to 13 carbon atoms, preferably benzyl and may be the same or different from each other and $X^-$ is a halogen ion or $SCN^-$;

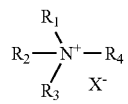

wherein $R_1$, $R_2$, $R_3$, and $R_4$ are each independently an alkyl group having one or more carbon atoms, preferably 1 to 6 carbon atoms, an aryl group having 6 to 12 carbon atoms such as phenyl, or a methoxymethyl group and may be the same or different from each other and $X^-$ is a halogen ion or $SCN^-$.

Any one or more of the solvents may be used in the present invention.

If necessary, a supporting electrolyte may be added. Examples of the supporting electrolyte include salts, acids, alkalis, ordinary-temperature melting salts which are generally used in the field of electrochemistry or electric batteries.

There is no particular restriction on the salts. For example, the salts may be inorganic ion salts such as alkali metal salts and alkaline earth metal salts, quaternary ammonium salts, cyclic quaternary ammonium salts, and quaternary phosphonium salts. Particularly preferred are Li salts.

Specific examples of the salts include Li, Na, and K salts having a counter anion selected from $ClO_4^-$, $BF_4^-$, $CF_3SO_3^-$, $(CF_3SO_2)_2N^-$, $(C_2F_5SO_2)_2N^-$, $PF_6^-$, $AsF_6^-$, $CH_3COO^-$, $CH_3(C_6H_4)SO_3^-$, and $(C_2F_5SO_2)_3C^-$.

The salts may also be any of quaternary ammonium salts having a counter anion selected from $ClO_4^-$, $BF_4^-$, $CF_3SO_3^-$, $(CF_3SO_2)_2N^-$, $(C_2F_5SO_2)_2N^-$, $PF_6^-$, $AsF_6^-$, $CH_3COO^-$, $CH_3(C_6H_4)SO_3^-$, and $(C_2F_5SO_2)_3C^-$, more specifically $(CH_3)_4N^+BF_4^-$, $(C_2H_5)_4N^+BF_4^-$, $(n-C_4H_9)_4N^+BF_4^-$, $(C_2H_5)_4N^+Br^-$, $(C_2H_5)_4N^+ClO_4^-$, $(n-C_4H_9)_4N^+ClO_4^-$, $CH_3(C_2H_5)_3N^+BF_4^-$, $(CH_3)_2(C_2H_5)_2N^+BF_4^-$, $(CH_3)_4N^+SO_3CF_3^-$, $(C_2H_5)_4N^+SO_3CF_3^-$, $(n-C_4H_9)_4N^+SO_3CF_3^-$, and those represented by the following formulas:

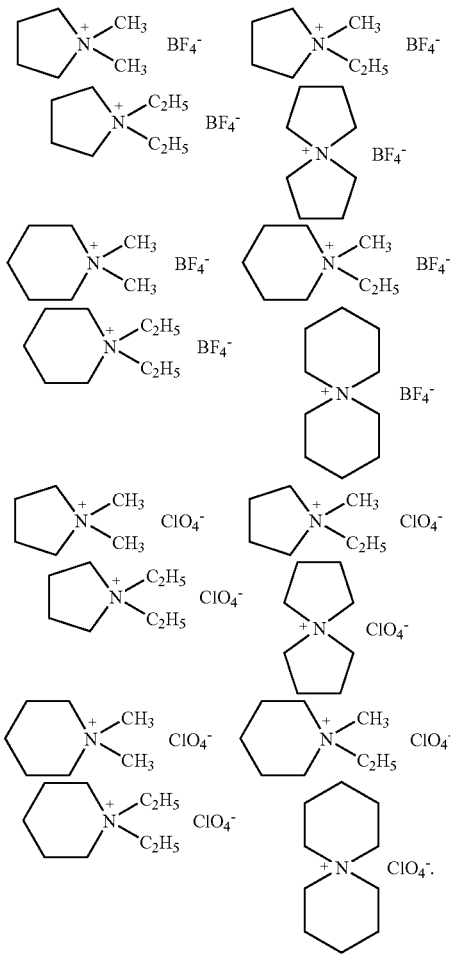

Furthermore, the salts may be any of phosphonium salts having a counter anion selected from $ClO_4^-$, $BF_4^-$, $CF_3SO_3^-$, $(CF_3SO_2)_2N^-$, $(C_2F_5SO_2)_2N^-$, $PF_6^-$, $AsF_6^-$, $CH_3COO^-$, $CH_3(C_6H_4)SO_3^-$, and $(C_2F_5SO_2)_3C^-$. More specific examples include $(CH_3)_4P^+BF_4^-$, $(C_2H_5)_4P^+BF_4^-$, $(C_3H_7)_4P^+BF_4^-$, and $(C_4H_9)_4P^+BF_4^-$.

A mixture of these compounds may be suitably used in the present invention.

There is no particular restriction on the acids, which, therefore, may be inorganic acids or organic acids. Specific examples of the acids include sulfuric acid, nitric acid, acetic acid, hydrochloric acid, boric acid, oxalic acid, phosphoric acids, sulfonic acids, and carboxylic acids.

There is no particular restriction on the alkalis, which, therefore, may be sodium hydroxide, potassium hydroxide, and lithium hydroxide.

The anodic-oxide porous alumina film used in the present invention is obtained by anodically oxidizing a material containing aluminum in the above-described electrolyte. There is no particular restriction on the cathode used for anodic oxidization. Examples of the cathode include graphite, glassy carbon, and metal plates of platinum, chromium, and SUS. There is no particular restriction on the temperature at which anodic oxidization is conducted. However, it is preferably from −40 to 100° C. There is no particular restriction on the voltage at which anodic oxidization is conducted. However, it is preferably from 1 to 300 V. The time for which anodic oxidization is conducted varies depending on the type of the electrolyte, the applied voltage and the film thickness of the desired film mold but is preferably from 1 minute to 100 hours. In order to obtain an anodic-oxide porous alumina film with more highly regulated pores, anodic oxidization may be conducted after a part of the initial anodic-oxide film is dissolved or after concavities and convexities are provided in a desired regulated pattern on a material to be anodically oxidized.

In the present invention, there are two types of methods of manufacturing the nano-array electrode using the above-described anodic-oxide porous alumina film, as a mold, such as method (A) wherein an electrode material is filled into the fine pores of the anodic-oxide porous alumina film and method (B) wherein after a material is filled into the fine pores of the anodic-oxide porous alumina film, an electrode material is filled into the spaces defined between the nano-arrays formed by removing the anodic-oxide porous alumina film. Furthermore, in method (A), the anodic-oxide porous alumina film may be left (A-1) or may be removed (A-2). In method (B), the material having been filled into the fine pores of the anodic-oxide porous alumina film may be left (B-1) or may be removed (B-2). The nano-array electrode manufactured by each of the methods is schematically shown in FIG. 1.

There is no particular restriction on the electrode material to be filled into the fine pores of the anodic-oxide porous alumina film. Examples of the electrode material include metals such as gold, silver, nickel, platinum, chromium, tungsten, and copper; inorganic semiconductor materials such as $TiO_2$, $WO_3$, $ZnO$, $Nb_2O_5$, $ZnS$, $SnO_2$, $SiO_2$, $Si$, $PbS$, $CdS$, $Fe_{1-x}M_xSi_2$ (x=0 or 1, M=Co, Mn, or Cr), $Bi_2S_3$, $CdSe$, $CuInS_2$, $CuInSe_2$, $Fe_2O_3$, $GaP$, $GaInAsP$, $GaAs$, $InP$, $GaSb$, $Ge$, $SiGe$, $CdTe$, $CuInGaSSe$, $CuInGaSe_2$, $MX_3$-based compounds (M=Co, Rh, or Ir; X=P, As, or Sb), $RM_4X_{12}$ (M=Fe, Ru, or Os; R=La, Ce, Pr, Nd, or Eu), $Bi_2Te_3$, $NaCo_2O_4$, $(ZnO)_mIn_2O_3$ (m=4 to 7, 9 or 11), $Ba_{1-x}Sr_xPbO_3$ (X=0 or 1), $Ni_{1-x}LiO$ (x=0 or 1), $Cd_3TeO_6$, $Cd_{3-x}A_xTeO_{6-\delta}$ (x=0 or 1, δ=0 to 0.8), and $Zn_{1-x}Al_xO$ (x=0 or 1); and organic semiconductor materials including conjugated organic matters such as polyphenylene vinylene (PPV) and polythiophene, organic substances such as those wherein conjugated substances bond via unconjugated chains, compounds with an electron-donating molecular structure, compounds with an electron-accepting molecular structure, polymers constituted by at least a polymer unit containing an electron-donating molecular structure and a polymer unit containing an electron-accepting molecular structure. Furthermore, the electrode material may be an alloy exhibiting a metal semiconductor transition behavior, such as $Gd_3Mg_7$, $YH_x$ (x=0 to 3), Y—Mg, Ni—Mg, $S_m$—Mg (m=0 to 3).

The term "electron-donating molecular structure" used herein denotes a structure exhibiting properties that the molecules are small in ionization potential and likely to become positive ions per se by supplying electrons to other molecules, while the term "electron-accepting molecular structure" denotes a structure exhibiting properties that the molecules are large in electron affinity and likely to become negative ions per se by accepting electrons from other molecules.

Since in the present invention, a compound having an electron-donating molecular structure and a compound having an electron-accepting molecular structure are used in combination, the above-described electron-donating and electron-accepting properties are determined automatically depending on the relative relationship between the compounds to be used. Therefore, combinations of such structures that fulfill these properties are arbitrarily selected.

There is no particular restriction on the molecular structure having electron-donating properties as long as it has electron-donating properties in the molecular structure portion. Examples of the structure include amine, metallocene, polyarylene vinylene, polyanyline, polythiophene, polypyrrole and polyamine structures.

There is no particular restriction on the molecular structure having electron-accepting properties as long as it has electron-accepting properties in the molecular structure portion. Examples of the structure include viologen, perylene and fullerene structures.

Specific examples of the molecular structures having electron-accepting properties include those represented by formulas (1) to (20) below, while specific examples of the molecular structures having electron-donating properties include those represented by formulas (21) to (63) below:

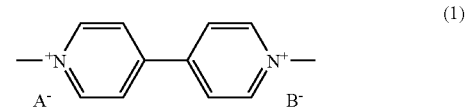

(1)

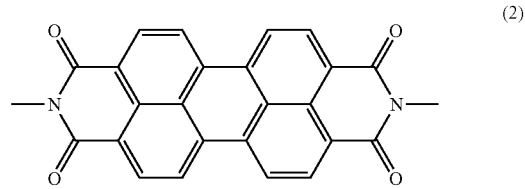

(2)

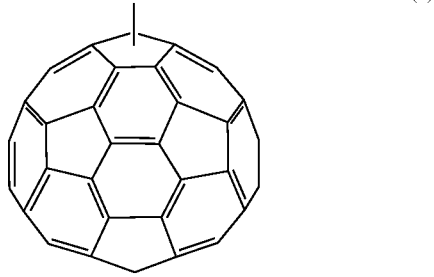

(3)

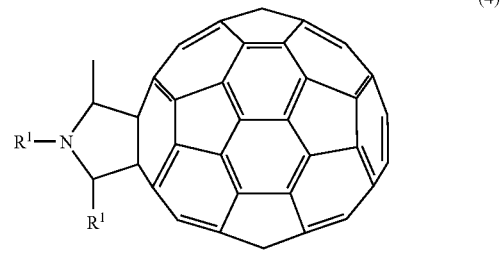

(4)

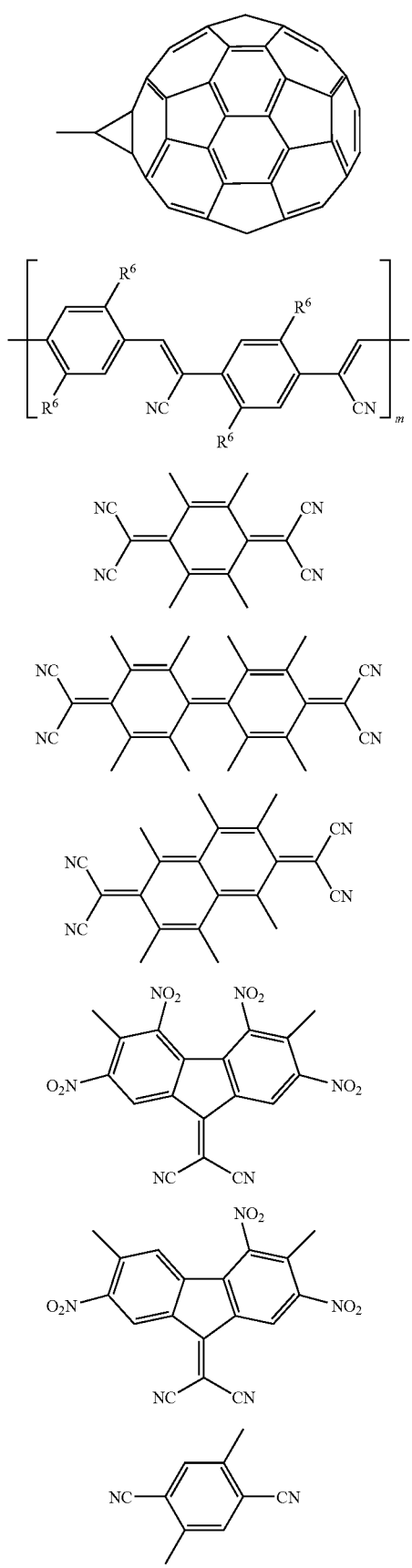

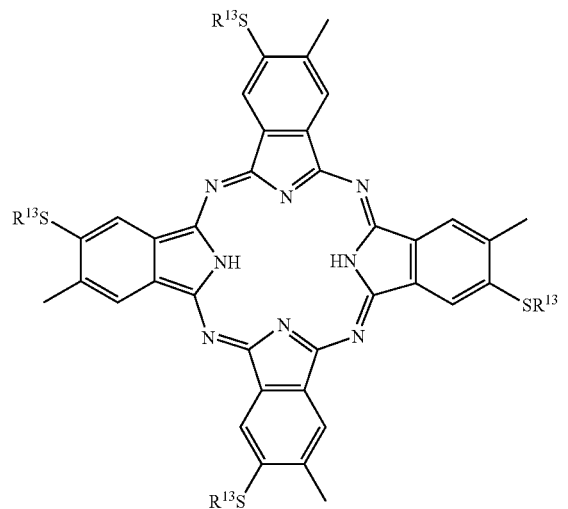
(21)
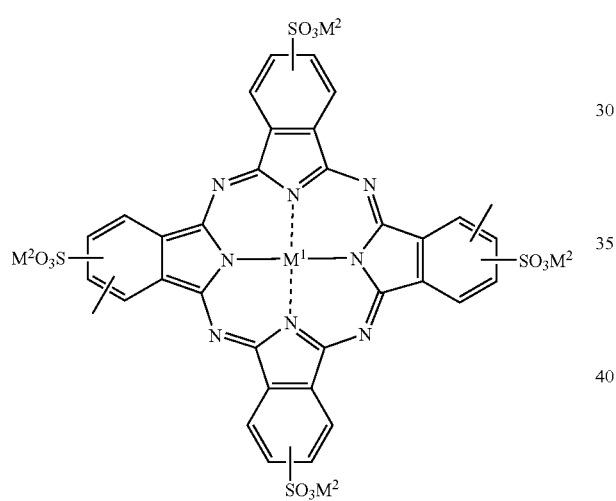
(22)
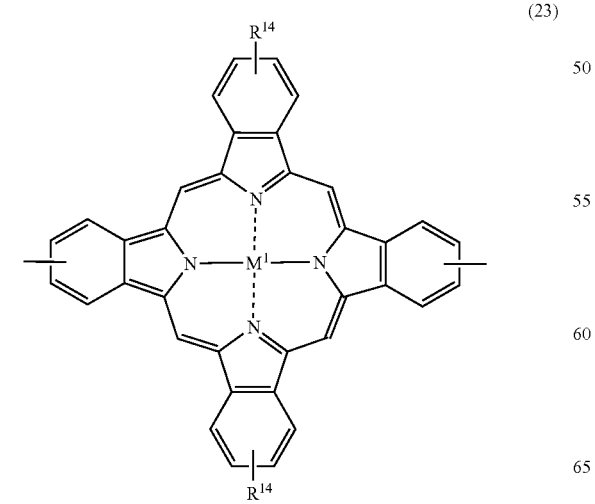
(23)
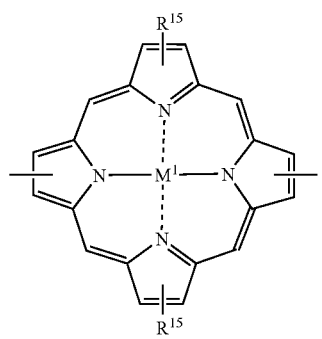
(24)
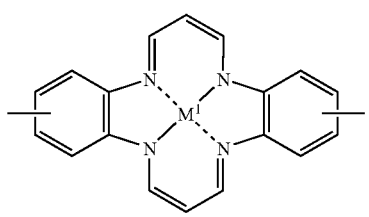
(25)
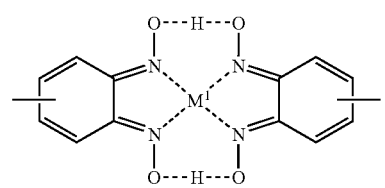
(26)
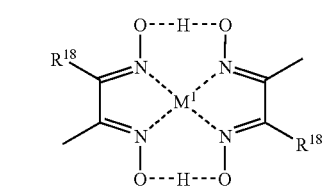
(27)
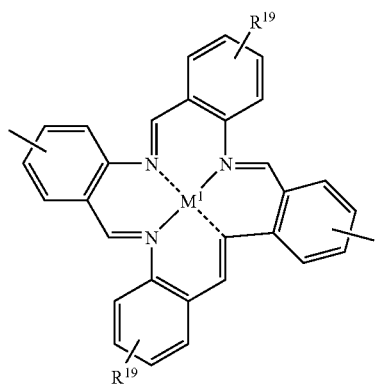
(28)
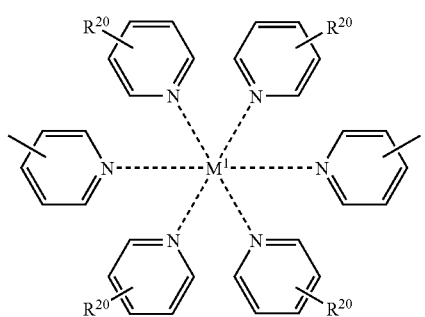
(29)

(30)
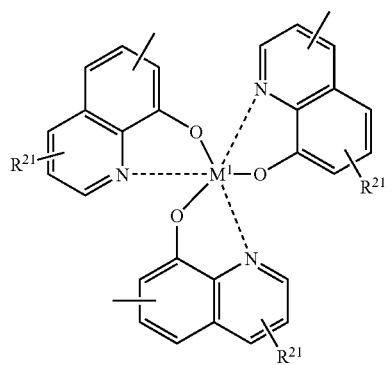
(31)
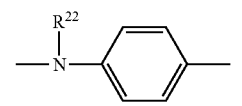
(32)
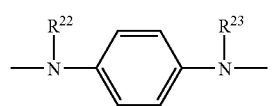
(33)
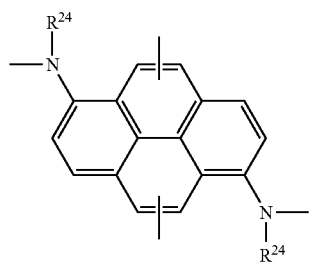
(34)
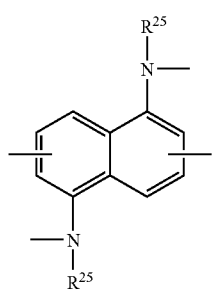
(35)
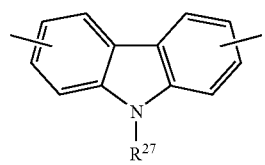
(36)
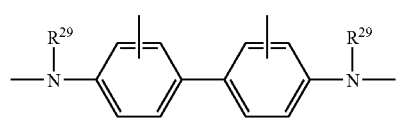
(37)
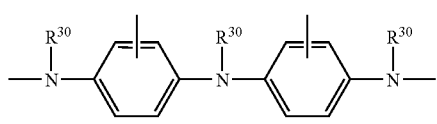
(38)
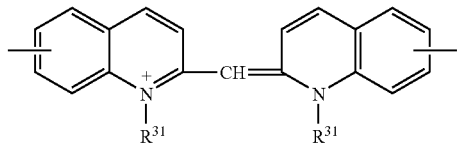
(39)
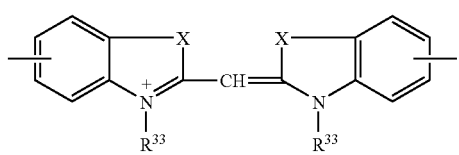
X = S, O, Se
(40)
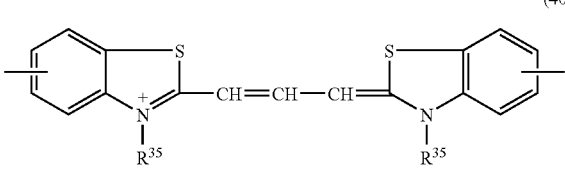
(41)
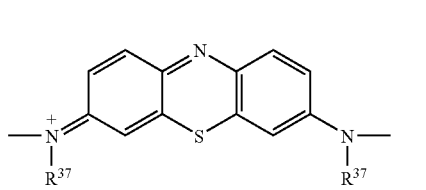
(42)
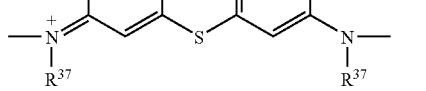
(43)
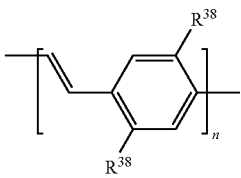
(44)
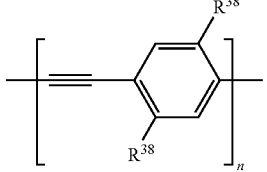
X = O, N, S
(45)
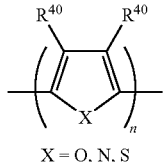
(46)
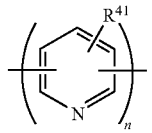

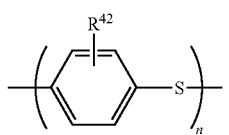 (47)
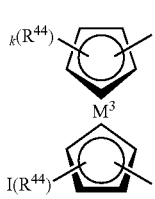 (48)
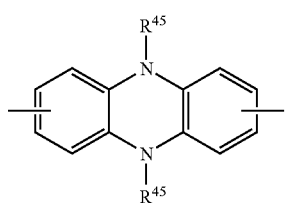 (49)
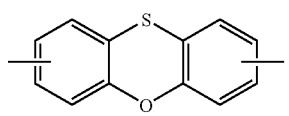 (50)
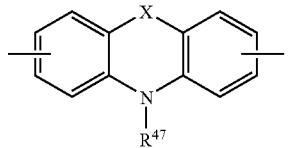 (51)
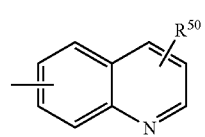 (52)
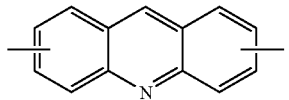 (53)
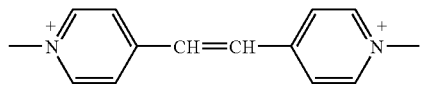 (54)
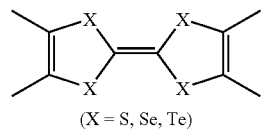 (55)
(X = S, Se, Te)
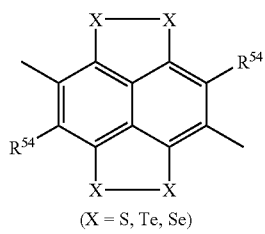 (56)
(X = S, Te, Se)
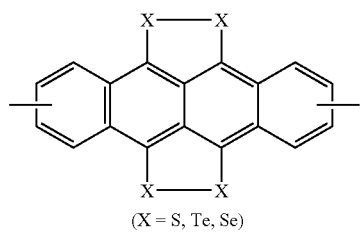 (57)
(X = S, Te, Se)
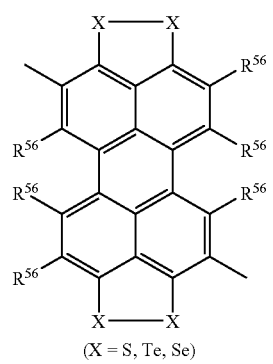 (58)
(X = S, Te, Se)
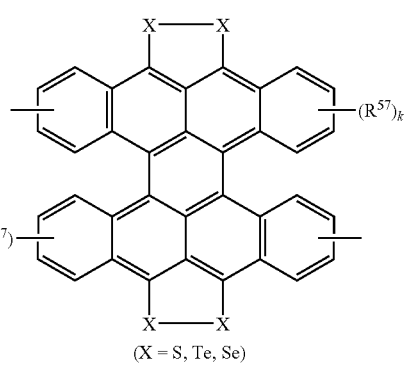 (59)
(X = S, Te, Se)
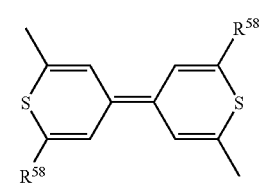 (60)
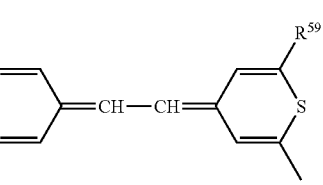 (61)
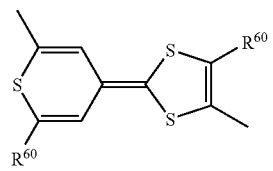 (62)

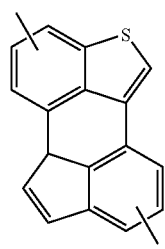

(63)

In formulas (1) to (63), $R^1$ to $R^{60}$ (excluding $R^{10}$ and $R^{12}$) may be the same or different from each other and are each independently hydrogen; a straight-chain or branched alkyl, alkenyl or alkoxyl group each having 1 to 10 carbon atoms; or an aryl, aralkyl, or aryloxy group having 6 to 12 carbon atoms. $R^{44}$ may bond to a cyclopentadienyl ring so as to form a ring or may form a group crosslinking cyclopentadienyl rings which are different from each other.

$R^{10}$ and $R^{12}$ may be the same or different from each other and are each independently hydrogen, halogen, a cyano, nitro, hydroxyl, amino, carboxyl, acetyl, or formyl group, a straight-chain or branched alkyl, alkenyl, alkoxyl, alkylthio or alkyloxycarbonyl group having 1 to 10 carbon atoms, or an aryl, aralkyl, or aryloxy group having 6 to 12 carbon atoms.

When a plurality of $R^6$ to $R^{60}$ groups exist in one of the above formulas, they may be the same or different from each other.

$A^-$ and $B^-$ may be the same or different from each other and are each independently a counter anion selected from the group consisting of halogen anions, $ClO_4^-$, $BF_4^-$, $PF_6^-$, $CH_3COO^-$, and $CH_3(C_6H_4)SO_3^-$.

In the above formulas, m and n are each independently an integer of 1 to 1,000, preferably 2 to 500, and k and l each indicate the number of each cyclic hydrocarbon group which can be substituted and are each usually an integer of 0 to 4.

$M^1$ is a metal atom such as Cu, Zn, Co, Fe, Ti, Mg, Ni, Mo, Os, and Ru. $M^2$ is an alkali metal or alkaline earth metal such as Li, Na, Mg, and Ca. $M^3$ is Cr, Co, Fe, Mg, Ni, Os, Ru, V, X—Hf—Y, X—Mo—Y, X—Nb—Y, X—Ti—Y, X—V—Y or X—Zr—Y wherein X and Y are each independently hydrogen, halogen or an alkyl, alkenyl, alkoxy, aryl or aralkyl group having 1 to 12 carbon atoms and may be the same or different from each other.

Examples of the alkyl group include methyl, ethyl, propyl, i-propyl, butyl, s-butyl, t-butyl, pentyl, isopentyl, neopentyl, t-pentyl, hexyl, isohexyl, heptyl, octyl, nonyl, and decyl groups. Examples of the alkenyl group include vinyl, allyl, isopropenyl, butylenyl, pentylenyl, and hexenyl group. Examples of the alkoxy group include methoxy, ethoxy, propoxy, i-propoxy, butoxy, s-butoxy, t-butoxy, pentoxy, isopentoxy, neopentyloxy, t-pentyloxy, hexyloxy, isohexyloxy, heptyloxy, octyloxy, nonyloxy, and decyloxy groups. Examples of the aryl group include phenyl, xylyl, tolyl, cumenyl, and naphthyl groups. Examples of the aralkyl group include benzyl and trimethyl. Examples of the aryloxy group include phenoxy and tolyloxy groups.

Specific examples of the compound having an electron-accepting molecular structure and that having an electron-donating molecular structure include polyacetylene, polypyrrole, polypyridine, poly-p-phenylene, poly-p-phenylenesulfide, polyphenylenevinylene, poly(2,5-dihexyloxy-1,4-phenylenevinylene), poly(2,5-dioctyloxy-1,4-phenylenevinylene), poly(2-methoxy-5-(2'-ethylhexyloxy)-1,4-phenylenevinylene), and compounds represented by formulas (64) to (126) below:

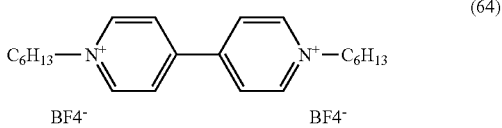
(64)

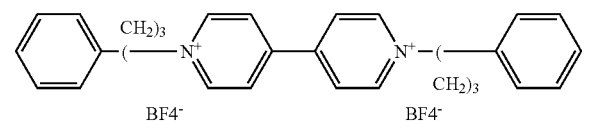
(65)

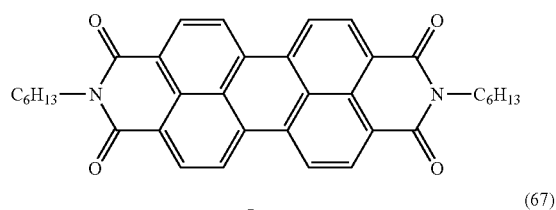
(66)

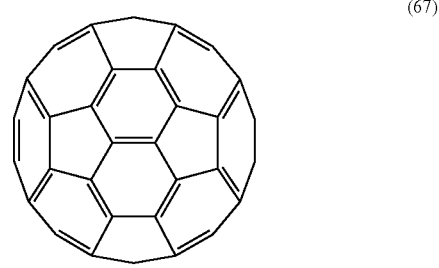
(67)

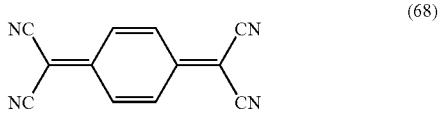
(68)

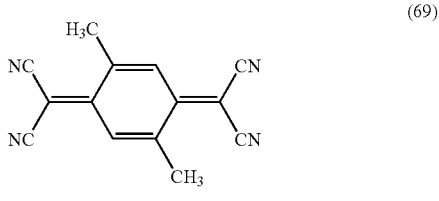
(69)

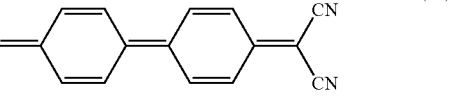
(70)

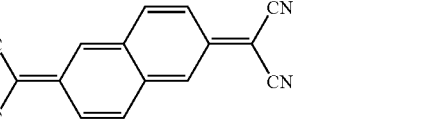
(71)

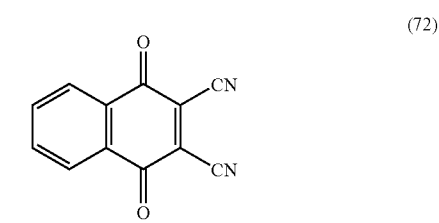
(72)

(73)
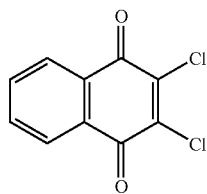
(74)
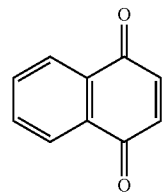
(75)
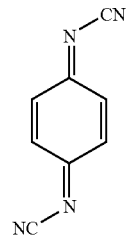
(76)
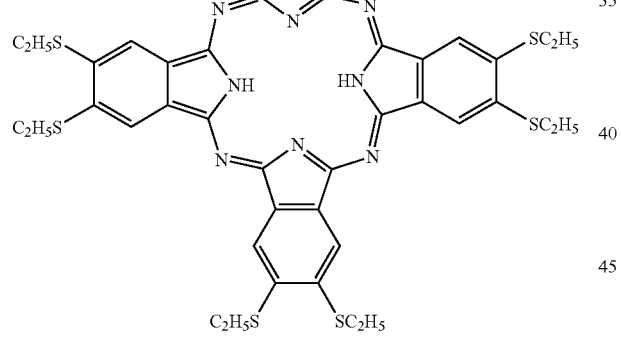
(77)
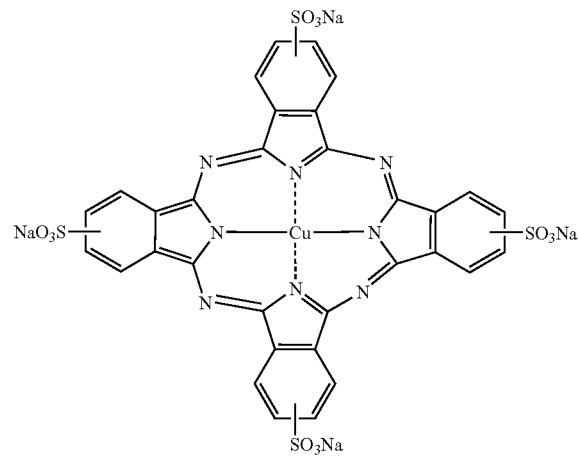
(78)
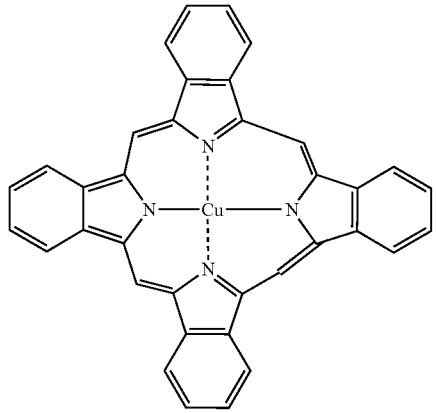
(79)
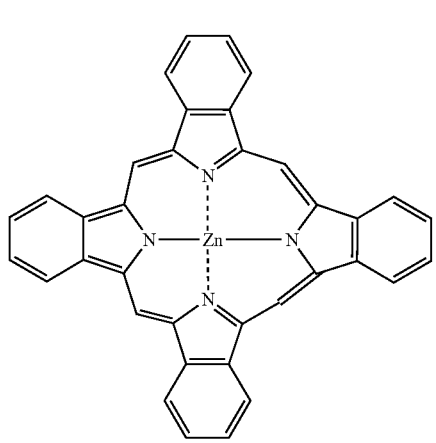
(80)
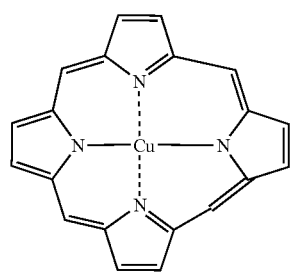
(81)
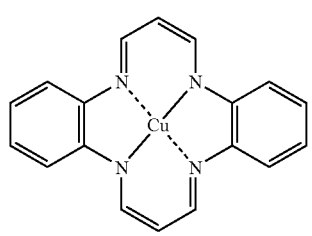
(82)
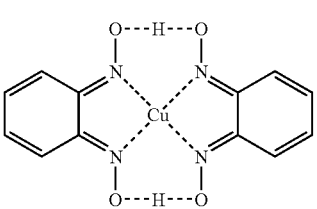

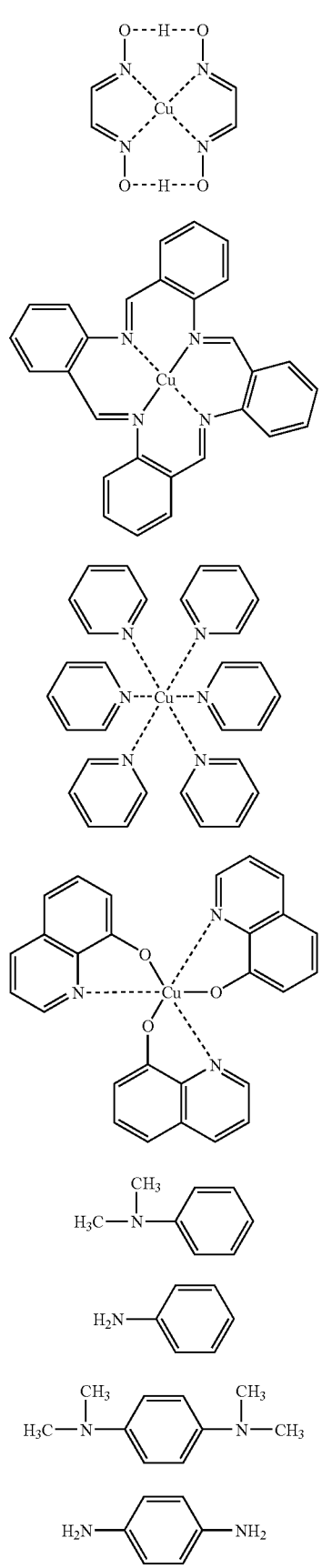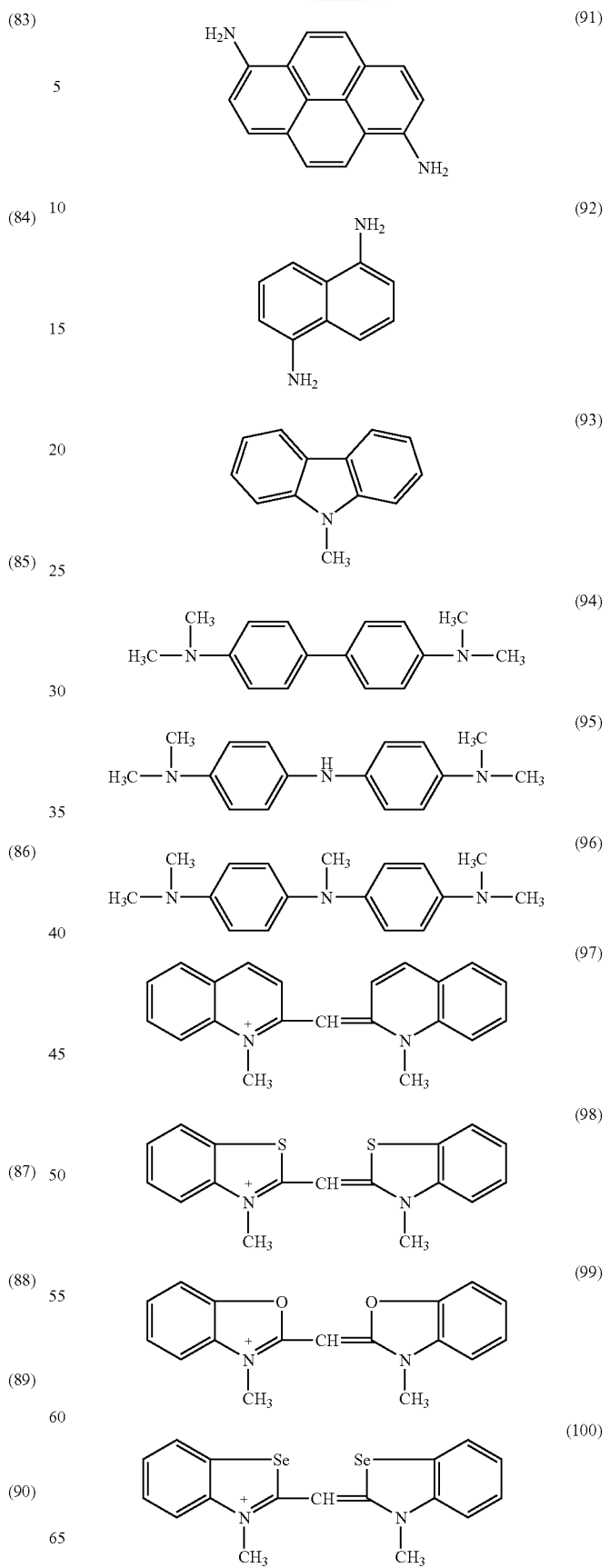

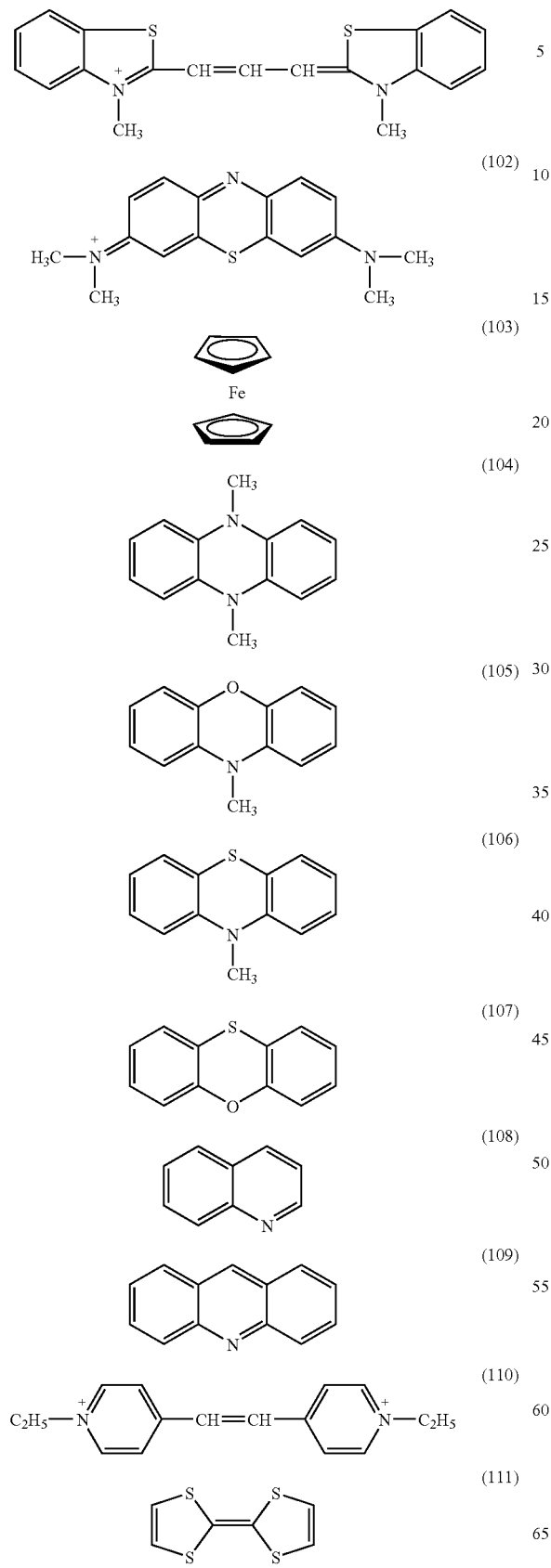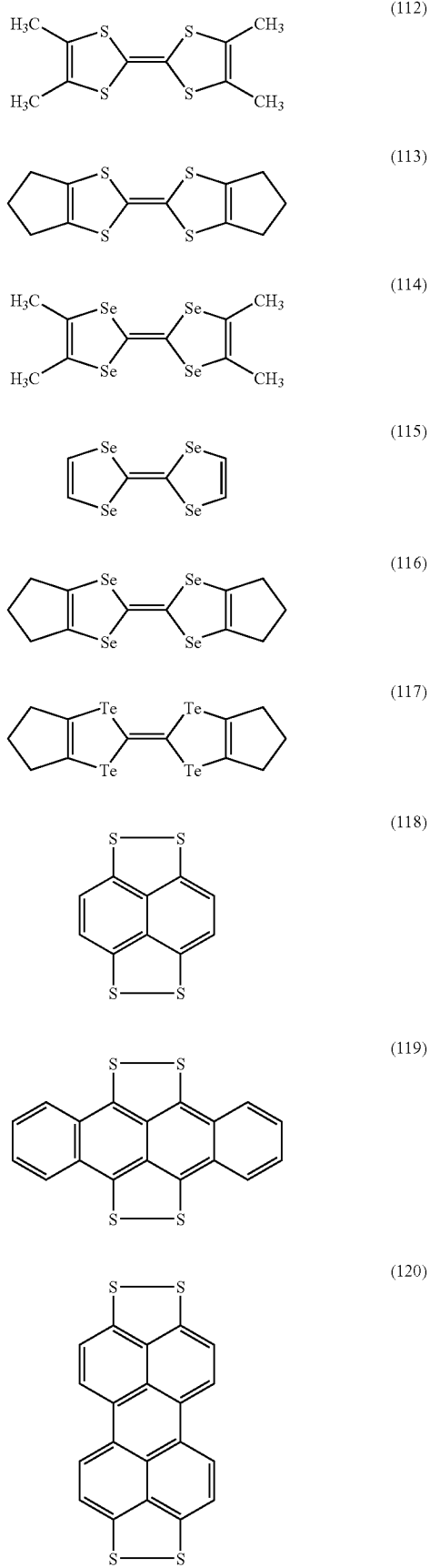

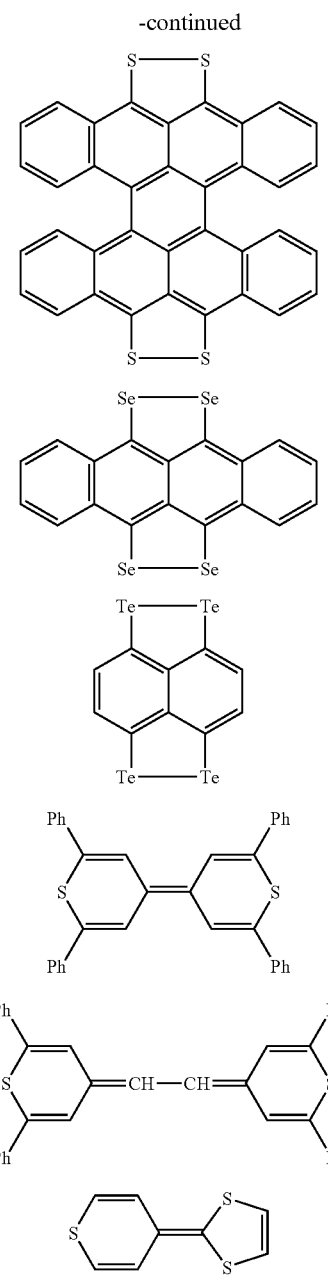

Preferred combinations of the electron-accepting molecular structure and the electron-donating molecular structure are a fullerene derivative (formula (3)) and a poly(phenylenevinylene) derivative (formula (42)); a cyano group-containing poly(phenylenevinylene) derivative (formula (6)) and a poly(phenylenevinylene) derivative (formula (42)); a viologen derivative (formula (1)) and an amine derivative (formulas (31) to (37)); a viologen derivative (formula (1)) and a metallocene derivative (formula (48)); a viologen derivative (formula (1)) and a polythiophene derivative (formula (44)); a viologen derivative (formula (1)) and a polypyrrole derivative (formula (44)); a viologen derivative (formula (1)) and a poly(phenylenevinylene) derivative (formula (42)); a perylene derivative (formula (2)) and a copper phthalocyanine derivative (formulas (22) to (24)); a perylene derivative (formula (2)) and a phthalocyanine derivative (formula (21)); a perylene derivative (formula (2)) and an amine derivative (formulas (31) to (37)); a perylene derivative (formula (2)) and a poly(phenylenevinylene) derivative (formula (42)); a perylene derivative (formula (2)) and a polythiophene derivative (formula (44)); a perylene derivative (formula (2)) and a polypyrrole derivative (formula (44)); a perylene derivative (formula (2)) and a metallocene derivative (formula (48)); a fullerene derivative (formula (3)) and a copper phthalocyanine derivative (formulas (22) to (24)); a fullerene derivative (formula (3)) and an amine derivative (formulas (31) to (37)); a fullerene derivative (formula (3)) and a polythiophene derivative (formula (44)); a fullerene derivative (formula (3)) and a polypyrrole derivative (formula (44)); a fullerene derivative (formula (3)) and a metallocene derivative (formula (48)); a cyano group-containing poly(phenylenevinylene) derivative (formula (6)) and an amine derivative (formulas (31) to (37)); a cyano group-containing poly(phenylenevinylene) derivative (formula (6)) and a copper phthalocyanine derivative (formulas (22) to (24)); a cyano group-containing poly(phenylenevinylene) derivative (formula (6)) and a polythiophene derivative (formula (44)); a cyano group-containing poly(phenylenevinylene) derivative (formula (6)) and a polypyrrole derivative (formula (44)); and a cyano group-containing poly(phenylenevinylene) derivative (formula (6)) and a metallocene group (formula (48)).

These structures having an electron-accepting property or an electron-donating property are preferably those with carrier mobility. Whether the structures have carrier mobility can be easily determined by a conventional method. For example, a polymer mostly constituted by any of these structure is prepared, and then the carrier mobility of the polymer is measured by a time-of-flight method thereby determining whether the structure has carrier mobility or not (for example, see examples of measurement described in Jpn. J. Appl. Phys., Vol. 38, pp. L1188 (1999). The structure are those with a carrier mobility of $10^{-7}$ to $10^3$ cm$^2$/V·s, preferably $10^{-6}$ to 10 cm$^2$/V·s.

Figure 2:
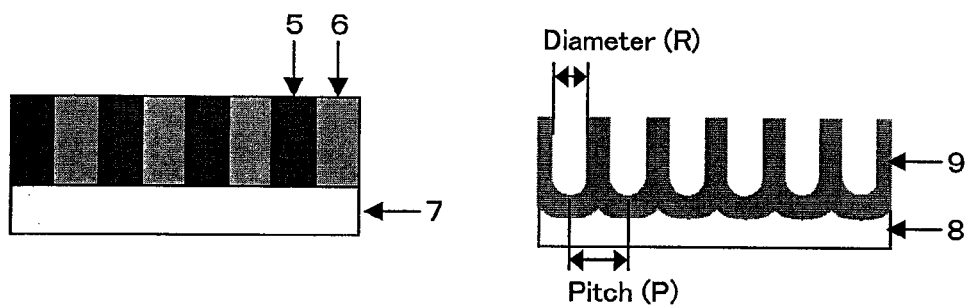
FIG. 2 is a schematic view for illustrating the use of an organic semiconductor material.
Figure 3:
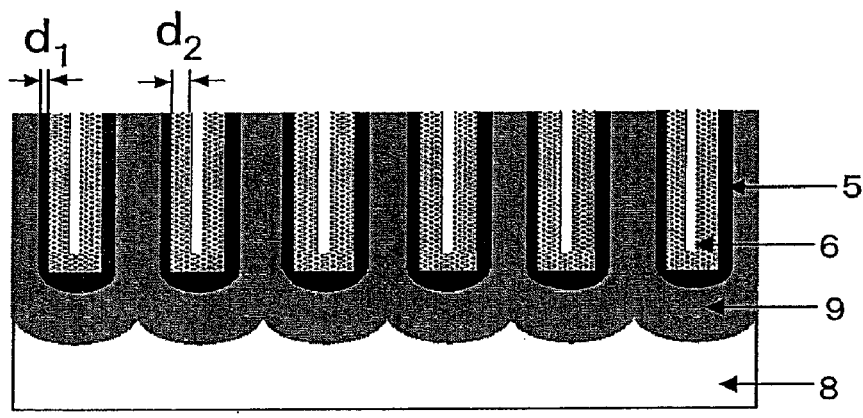
FIG. 3 is a schematic view for illustrating the use of an organic semiconductor material.

A nano-array electrode with a structure as shown in FIG. 2 may be obtained using any of the above-described organic semiconductor materials. More specifically, for example, after a compound with an electron-accepting structure or an electron-donating structure is filled into the fine pores of an anodic-oxide porous alumina film obtained by anodically oxidizing aluminum, laminated on the transparent electrically conductive layer of a transparent electrically conductive substrate, a compound with an electron-donating structure is filled into the spaces defined between the nano-arrays formed by removing the anodic-oxide porous alumina film if the nano-arrays are formed of the compound with an electron-accepting structure, and a compound with an electron-accepting structure is filled into the spaces defined between the nano-arrays formed by removing the anodic-oxide porous alumina film if the nano-arrays are formed of the compound with an electron-donating structure thereby obtaining the nano-array electrode as shown in FIG. 2. In this case, the diameter (R) of the pores of the anodic-oxide porous alumina film used as a mold is preferably 10 time or less of the exciton diffusion length (L) of the organic semiconductor material to be filled at first (R≦10 L). Furthermore, the value (P−R) determined by deducting the diameter (R) of the pores of the anodic-oxide porous alumina film from the pitch (P: pitch between the fine pores) is preferably 10 times or less of the exciton diffusion length (L') of the organic semiconductor material to be filled next (P−R≦10 L'). Alternatively, in the case where a multi-layered film is laminated in the fine pores of the anodic-oxide porous alumina film used as a mold as shown in FIG. 3, the film thickness of each of the layered films ($d_i$: i is the number of films of the layered films and an integer of 2 or greater, and $\Sigma d_i \leq R/2$) is preferably 10 times or less of the exciton diffusion length ($L_i$) of the corresponding organic semiconductor material forming the film (di≦10Li). The exciton diffusion length is a distance that exciton generated by light absorption diffuses before their quantity decreases by 1/e. The value can be determined by measuring the photoluminescence quenching of an electrode material as a function of the thickness thereof.

Alternatively, the electrode material to be filled into the fine pores of the anodic-oxide porous alumina film may be a block copolymer constituted by at least a polymer unit with an electron-donating molecular structure and a polymer unit with an electron-accepting molecular structure. The block copolymer may be any of those containing such unit structures in their main chain or side chain, but are preferably those containing the unit structures in their main chain.

These structures are desirously those having carrier mobility. Whether the structures have carrier mobility can be easily determined by a conventional method. For example, a homopolymer mostly constituted by these structures is prepared, and then the carrier mobility of the homopolymer is measured by a time-of-flight method thereby determining whether the structure has carrier mobility or not. The structures are those with a carrier mobility of $10^{-7}$ to $10^3$ cm²/V·s, preferably $10^{-6}$ to 10 cm²/V·s. Furthermore, these structures are preferably those with electric conductivity. Whether or not these structures have electric conductivity can be easily determined in a conventional manner. For example, a homopolymer mostly constituted by these structures is prepared, and then the carrier mobility of the homopolymer is measured by a conventional method after the compound is doped. The structures are those with an electric conductivity of $10^{-6}$ to $10^6$ S/cm, preferably $10^{-6}$ to $10^4$ S/cm.

A film of the above-described block copolymer forms a micro phase separation structure consisting of an electron-donating phase and an electron-accepting phase by self-organization. The term "micro phase separation structure" used herein denote a phase separation structure wherein the domain size of each phase of the electron-donating phase or the electron-accepting phase is from few nm to few hundreds nm (usually from 1 to 500 nm). The domain size can be measured with an electron microscope or a scanning probe microscope. Furthermore, the film of the above-described block copolymer has a micro phase separation structure domain size 10 time or less of, preferably 5 times or less of, and more preferably equal to the exciton diffusion length. The exciton diffusion length may be determined by measuring the photoluminescence quenching of a polymer or oligomer of each unit constituting the block copolymer as a function of the thickness thereof. The measured diffusion length value varies depending on whether the phase to be measured is an electron-donating phase or an electron-accepting phase, but is generally several tens of nm. Furthermore, the film of the foregoing block copolymer has a micro phase separation domain structure of preferably a continuous layer or a quantum well structure.

Figure 4:
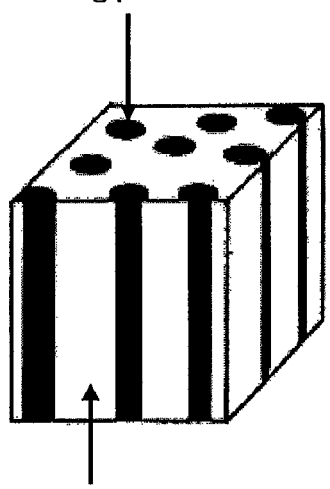
FIG. 4 shows an example where the domain structure of a photoelectric conversion layer is a continuous layer.
Figure 5:
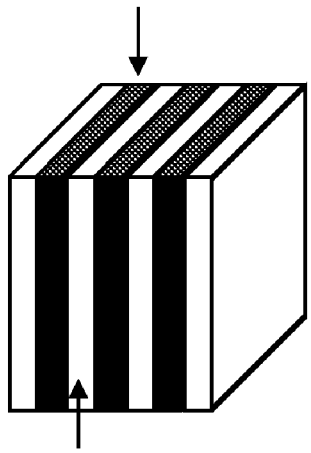
FIG. 5 shows an example where the domain structure of a photoelectric conversion layer is a quantum well structure.
Figure 6:
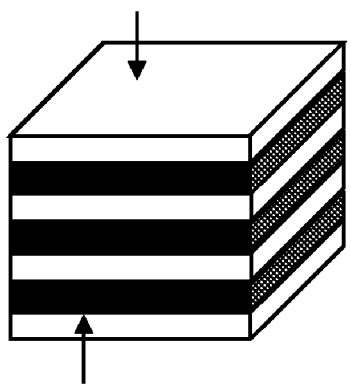
FIG. 6 shows an example where the domain structure of a photoelectric conversion layer is a quantum well structure.

The term "a domain structure of a continuous layer" used herein denotes a structure wherein either one of the domain structures constituted by an electron-donating phase or an electron-accepting phase is continuously formed in a block copolymer as shown in FIG. 4. The term "a domain structure of a quantum well structure" used herein denotes a structure wherein the domain structures each constituted by an electron-donating phase or an electron-accepting phase are alternately laminated on each other in a block copolymer as shown in FIGS. 5 and 6. The domain structure shown in FIGS. 4, 5, and 6 are typical examples, and thus structures similar thereto are also encompassed within the scope of the present invention.

Specific examples of the block copolymer which may be used in the present invention include those represented by formulas (127) to (135) below:

(127)

(128)

(129)

(130)

(131)

(132)

(133)

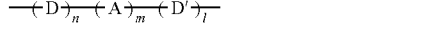
(134)

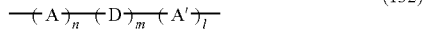
(135)

In formulas (127) to (135), A, A' are each a molecular group containing an electron-accepting molecular structure, while D, D' are each a molecular group containing an electron-donating molecular structure. R is a polymer residue. Although there is no particular restriction on specific examples of polymers represented by the above formulas, they include those represented by the following formulas:

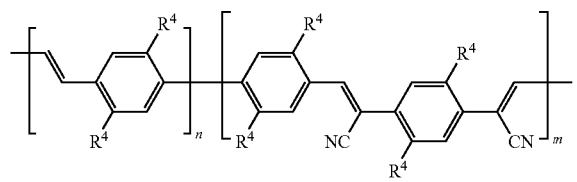
(136)

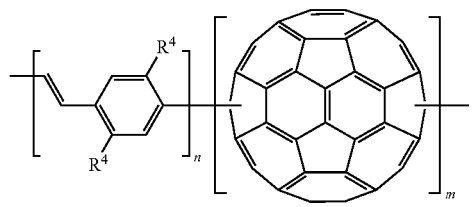
(137)

(138)
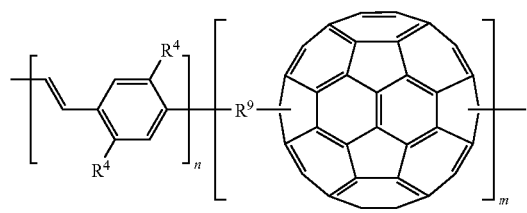
(139)
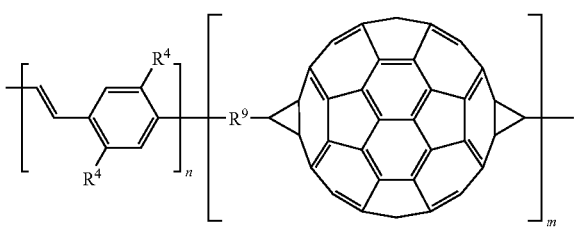
(140)
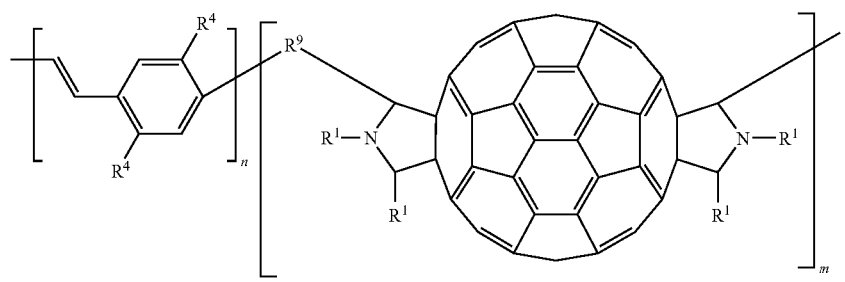
(141)
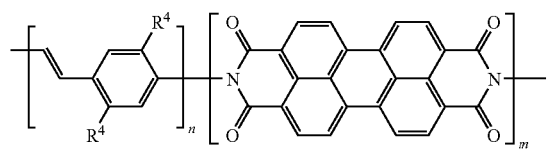
(142)
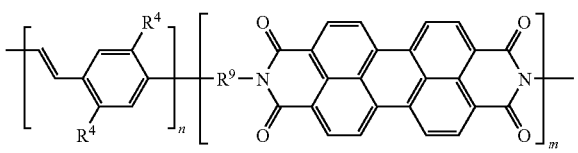
(143)
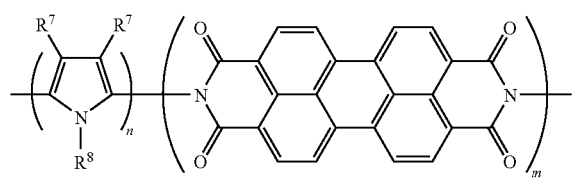
(144)
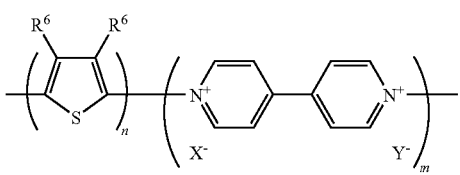
(145)
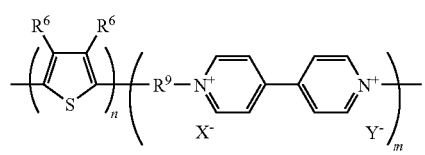
(146)
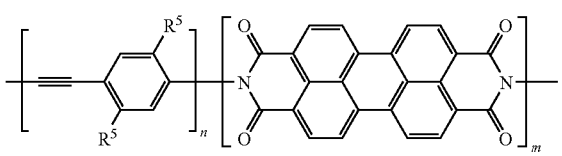
(147)
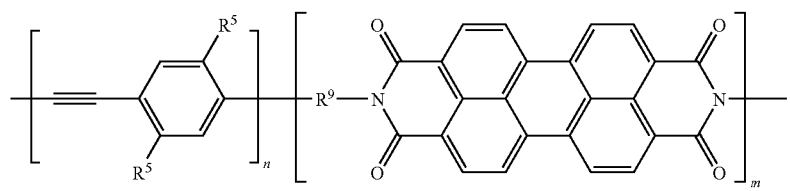

(148) 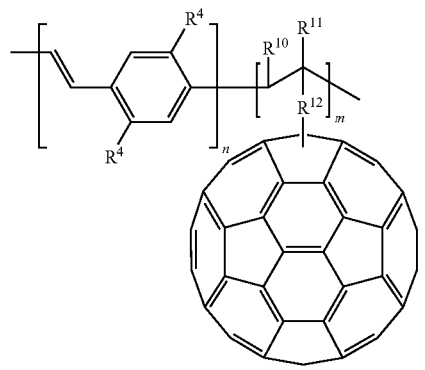
(149) 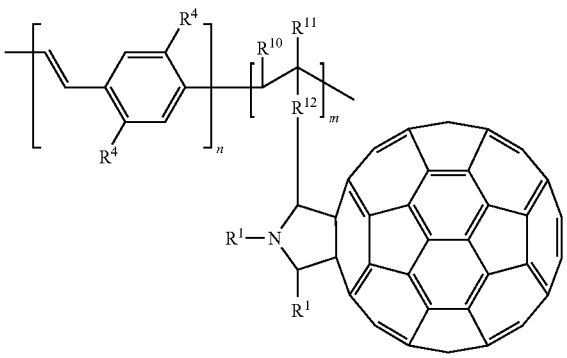
(150) 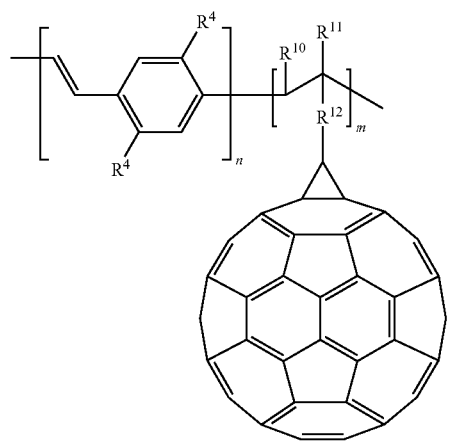
(151) 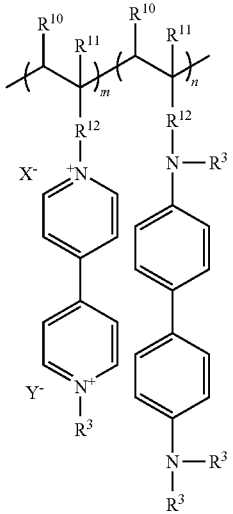
(152) 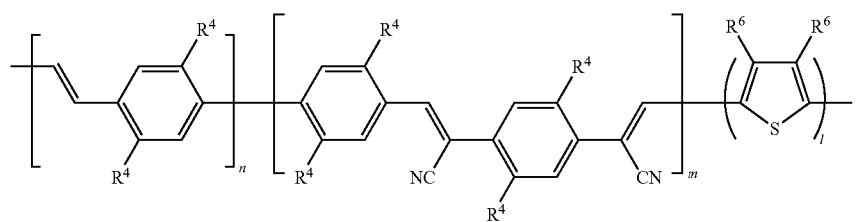
(153) 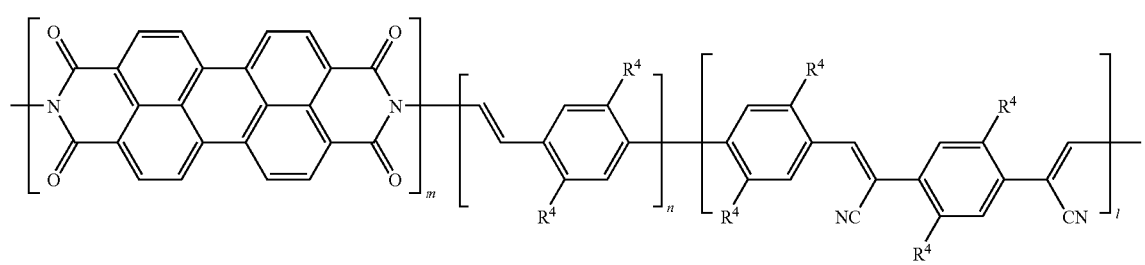

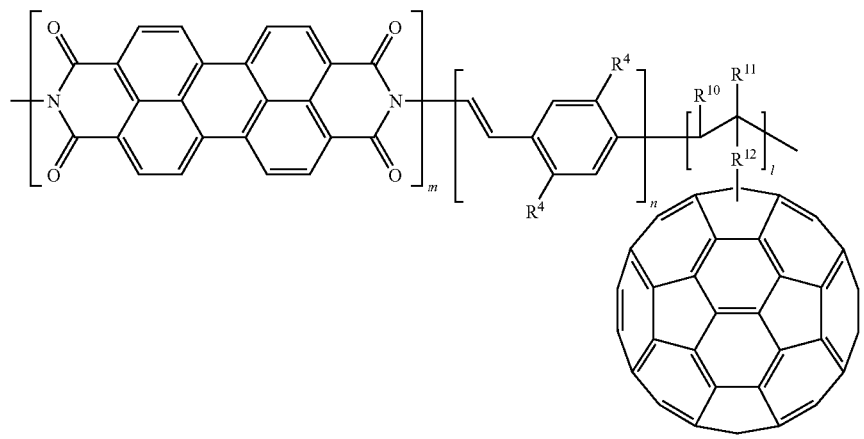

(154)

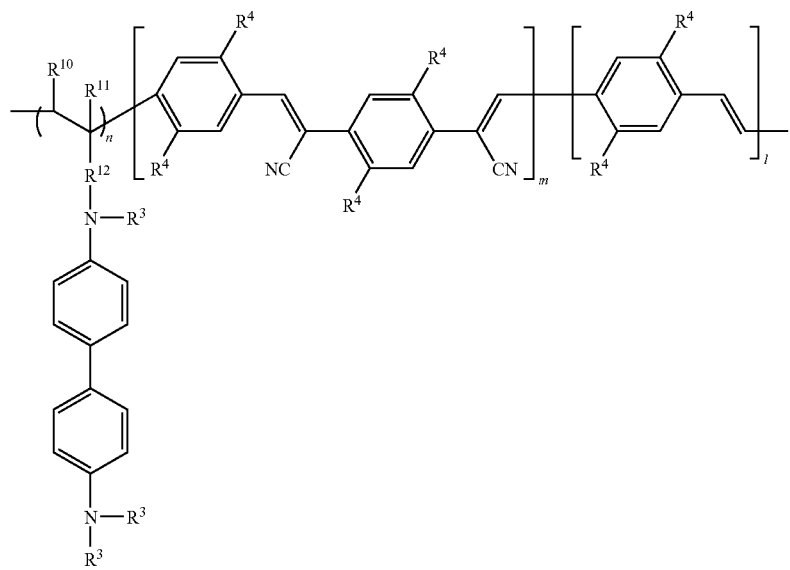

(155)

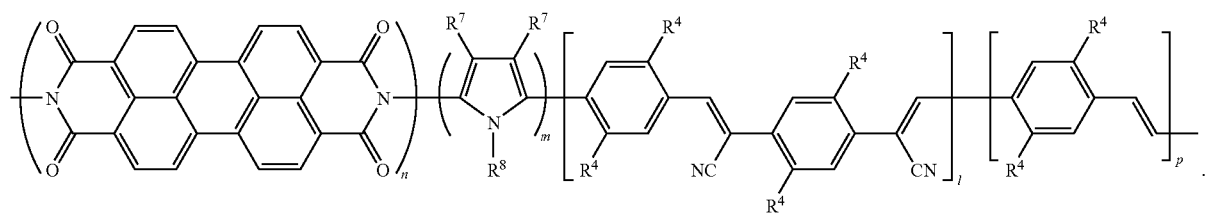

(156)

In formulas (136) to (156), $R^1$ to $R^{11}$ (excluding $R^9$) may be the same or different from each other and are each independently hydrogen or an alkyl group having 1 to 5 carbon atoms, while $R^9$ and $R^{11}$ are each independently an alkylene group having 1 to 10 carbon atoms, an arylene group having 6 to 12 carbon atoms, an oxygen- or nitrogen-containing alkylene group having 1 to 10 carbon atoms, or an oxygen- or nitrogen-containing arylene group having 6 to 12 carbon atoms. Examples of the alkylene group include methylene, ethylene, trimethylene, tetramethylene, and isopropylene groups, while examples of the arylene group include phenylene and tolylene groups.

In formulas (136) to (156), l, m, n, and p are each independently an integer of usually 2 to 10000, preferably 3 to 5000, and more preferably 4 to 2000.

The terminal molecular groups of these copolymers vary depending on the method of manufacturing the same but are each usually hydrogen or a hydrocarbon group such as an alkyl, alkenyl or alkoxy group having 1 to 10 carbon atoms or an aryl, aralkyl, aryloxy or aralkyl group having 6 to 12 carbon atoms.

These copolymers may be produced by any of the conventional methods. Therefore, there is no particular restriction on the method of producing the copolymers. For example, the copolymers may be produced by a condensation polymerization reaction of a dihalogen compound with an electron-accepting structure or an electron-donating structure with a strong base or a radical, anion or cation polymerization of a monomer compound with an electron-accepting structure or an electron-donating structure and various polymerizable groups.

There is no particular restriction on the method of filling the electrode material into the fine pores of the anodic-oxide porous alumina film. Therefore, the method may be selected from wet methods such as solution immersion, electrodeposition, electrocrystallization, electrolytic plating, electroless plating, and liquid phase particle growth method and dry methods such as vacuum deposition, sputtering, and CVD. Alternatively, depending on the material to be used, the electrode may be formed by filling an electrode precursor material into the pores and then polymerizing or calcining the material. The electrode material may be filled completely or partially into the fines pores. When the electrode material is filled completely into the fine pores, it is formed into rod-like nano-arrays. When the electrode material is filled partially into the fine pores, it is formed into tube-like nano-arrays. Alternatively, in the case where the electrode material is filled partially into the fine pores, different electrode materials may be repeatedly filled into the fine pores thereby obtaining nano-arrays each formed of such different materials laminated one after another. The filling of the fine pores may be repeated any time until the pores are fully filled.

The anodic-oxide porous alumina film may be removed after the electrode material is filled into the fine pores thereof. There is no particular restriction on the method of removing the film. For example, a method may be employed wherein the film is dipped into an acid aqueous solution, an alkali aqueous solution, or a chromic acid aqueous solution.

After the electrode material is filled into the fine pores or the anodic-oxide porous alumina film is removed if necessary, the resulting nano-array electrodes may be subjected to an after-treatment such as calcination. Examples of the after-treatment other than calcination include metal-film formation and adhesion to a support such as polymers.

In the case where the nano-array electrodes are manufactured by the above-mentioned method (B), there is no particular restriction on the material to be filled into the fine pores. However, examples of the material include polymerizable monomers such as methyl methacrylate and methyl acrylate, polymers such as polymethyl methacrylate, and metals such as gold, silver, copper, nickel, chromium, and platinum. There is no particular restriction on the method of filling the material into the fine pores of the anodic-oxide porous alumina film. Therefore, the method may be selected from wet methods such as solution immersion, electrodeposition, electrocrystallization, electrolytic plating, electroless plating, and liquid phase particle growth method and dry methods such as vacuum deposition, sputtering, and CVD. Alternatively, depending on the material to be used, a precursor material thereof may be filled into the fine pores and then subjected to a after-treatment such as polymerization or calcination. Alternatively, the material may be filled into the fine pores and then subjected to an after-treatment such as polymerization. Examples of the after-treatment other than polymerization include metal-film formation and calcination.

The anodic-oxide porous alumina film may be removed by any of the above-described method after the material is filled into the fine pores thereof and if necessary subjected to the after-treatment.

Thereafter, an electrode material is filled into the spaces defined between the resulting nano-arrays so as to form an nano-array electrode. The material to be filled into the spaces may be the same as those described above. The method of filling the electrode material may also be the same as those described. The electrode material may be filled completely or partially into the spaces. When the electrode material is filled completely into the spaces, it is formed into a honeycomb-shape nano-array electrode. When the electrode material is filled partially into the spaces, it is formed into a tube-like nano-array electrode.

Alternatively, after the electrode material is filled into the spaces, the material now acting as a mold may be removed. The method of removing the mold varies in the type of material. For example, if the mold is formed of a polymer material, it may be dipped into a solvent dissolving the polymer.

After the electrode material is filled into the spaces or the mold is removed if necessary, the resulting nano-array electrode may be subjected to an after-treatment such as calcination. Examples of the after-treatment other than calcination include polymerization and metal-film formation.

The nano-array electrode manufactured by the method of the present invention may be suitably used in a photoelectric conversion device.

Figure 7:
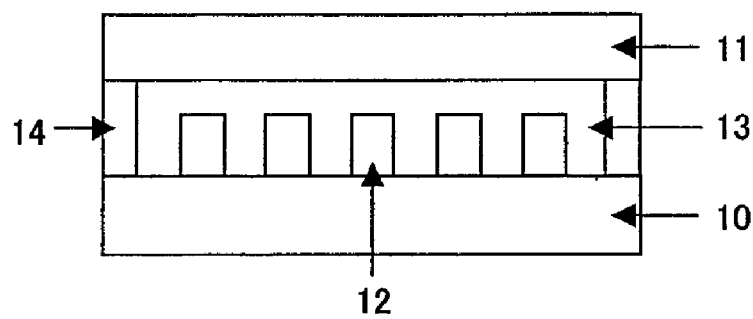
FIG. 7 is a sectional view of a photoelectric conversion device.
Figure 8:
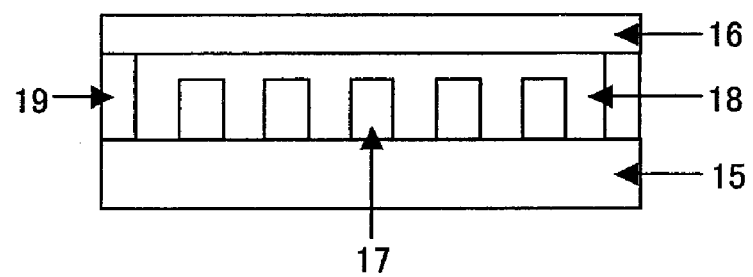
FIG. 8 is a sectional view of a photoelectric conversion device.
Figure 9:
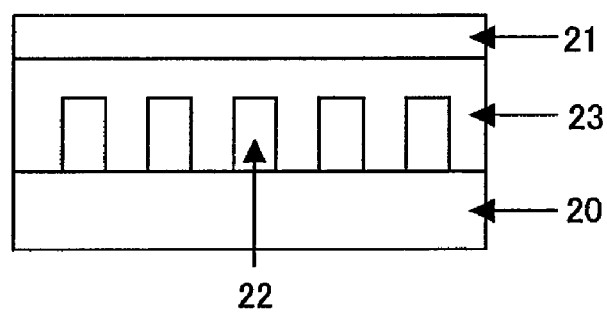
FIG. 9 is a sectional view of a photoelectric conversion device.

One structural example of an photoelectric conversion device is shown in FIG. 7 wherein a charge transport layer 13 is sandwiched between a nano-array semiconductor electrode 12 formed on a transparent electrically conductive substrate 10 and a counter electrode substrate 11. Another example is shown in FIG. 8 wherein a semiconductor layer 18 and a transparent electrode layer 16 are laminated in this order on a nano-array electrode 17 of a charge transport material formed on an electrically conductive substrate 15. The other example is shown in FIG. 9 wherein a compound layer 23 having an electron-accepting structure or an electron-donating structure and an electrode layer 21 are laminated in this order on a nano-array electrode 22 of a compound having an electron-accepting structure or an electron-donating structure formed on an electrically conductive substrate 20. In this case, at least either one of the electrically conductive substrate 20 or electrode layer 21 must be transparent.

The transparent electrically conductive substrate is usually that wherein a transparent electrode layer is formed on a transparent substrate.

There is no particular restriction on the transparent substrate. The material, thickness, size, and shape of the substrate can be properly selected depending on the purposes. For example, the substrate may be selected from colored or colorless glasses, wire glasses, glass blocks. Alternatively, the substrate may be formed of a colored or colorless transparent resin. Specific examples of such a resin include polyesters such as polyethylene terephthalate, polyamides, polysulfones, polyethersulfones, polyether ether ketones, polyphenylene sulfides, polycarbonates, polyimides, polymethylmethacrylates, polystyrenes, cellulose triacetates, and polymethyl pentenes. The term "transparent" used herein denotes a transmissivity of 10 to 100 percent, preferably 50 percent of greater. The substrates used herein may be those having a smooth surface at ordinary temperature, which surface may be flat or curved or deformable with stress.

There is no particular restriction on the electrode layer as long as it can achieve the purpose of the present invention. For example, the electrode layer may be a metal film of gold, silver, chromium, copper, or tungsten or an electrically conductive film of a metal oxide. Preferred examples of the metal oxide include those obtained by doping to a metal oxide of tin or zinc a trace amount of a different metal element, such as Indium Tin Oxide (ITO ($In_2O_3$:Sn)), Fluorine doped Tin Oxide (FTO ($SnO_2$:F)), Aluminum doped Zinc Oxide (AZO (ZnO:Al)), and Indium doped Zinc Oxide (IZO (ZnO:In)).

There is no particular restriction on the film thickness of the electrode layer. However, it is usually from 50 to 5000 nm and preferably from 100 to 3000 nm. There is no particular restriction on the surface resistance (resistivity). However, it is usually from 0.5 to 500 $\Omega$/sq, preferably from 2 to 50 $\Omega$/sq.

There is no particular restriction on the method of forming the electrode layer. The method is properly selected from any conventional methods depending on the type of the above-described metal or metal oxide used as the electrode layer. In general, the method is selected from vacuum film forming methods such as vacuum deposition, ion plating, CVD, and sputtering and wet film forming methods such as electrocrystallization, electrophoresis, electrolytic plating, and electroless plating. When any of the vacuum film forming methods is employed, the electrode layer is desirously formed at a substrate temperature of 20 to 700° C. When any of the wet film forming methods is employed, the electrode layer is desirously formed at a substrate temperature of −20 to 300° C.

The counter electrode substrate may be a substrate which is electrically conductive or has one electric conductivity on at least one surface and may be any of the above-described transparent electrically conductive substrates or of opaque electrically conductive substrates. Examples of the opaque electrically conductive substrate include various metal electrodes and films of Au, Pt, Ct, and carbon formed on a glass substrate. As the case may be, a catalyst layer may be provided on the electrically conductive layer of the counter electrode substrate in order to facilitate electron transfer reaction thereof with an electron transport layer. Examples of such a catalyst include various metals such as gold and platinum and carbon.

There is no particular restriction on the semiconductor layer used in the photoelectric conversion device. For example, the above-described organic and inorganic semiconductor materials may be used. Preferred examples include CdS, CdSe, CuInS$_2$, CuInSe$_2$, Fe$_2$O$_3$, GaAs, InP, Nb$_2$O$_5$, PbS, SnO$_2$, TiO$_2$, WO$_3$, and ZnO. These materials may be used in combination. Particularly preferred are TiO$_2$, ZnO, SnO$_2$, and Nb$_2$O$_5$, while most preferred are TiO$_2$ and ZnO.

The semiconductor used in the present invention may be monocrystal or polycrystal. If the semiconductor is titanium oxide, the crystal system may be of anatase, rutile, or brookite type among which preferred is anatase type.

The thickness of the semiconductor layer may be properly selected but is 0.05 µm or more and 100 µm or less, preferably 0.5 µm or more and 50 µm or less, and more preferably 1 µm or more and 30 µm or less.

For the purpose of enhancing the light absorption efficiency of the semiconductor layer, various dyes may be adsorbed on or contained in the semiconductor layer.

There is no particular restriction on the dye used in the present invention as long as it can enhance the light-absorbing efficiency of the semiconductor layer. One or more of various metal complex dyes or organic dyes may be usually used. In order to improve the adsorptivity to the semiconductor layer, dyes having in their molecules a functional group such as carboxyl, hydroxyl, sulfonyl, phosphonyl, carboxylalkyl, hydroxyalkyl, sulfonylalkyl, and phosphonylalkyl groups are preferably used.

Eligible metal complex dyes are a complex of ruthenium, osmium, iron, cobalt, or zinc; metal phthalocyanine; and chlorophyll.

Examples of the metal complex dyes used in the present invention include those represented by the following formulas:

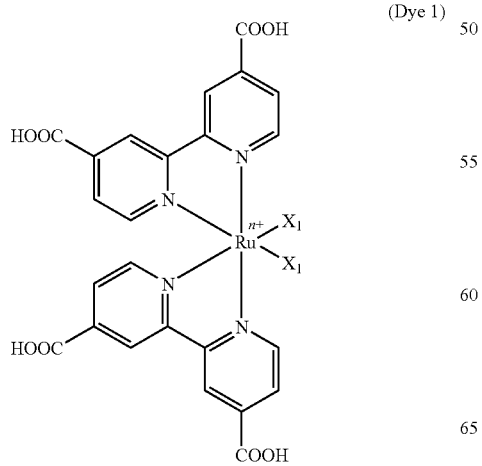
(Dye 1)

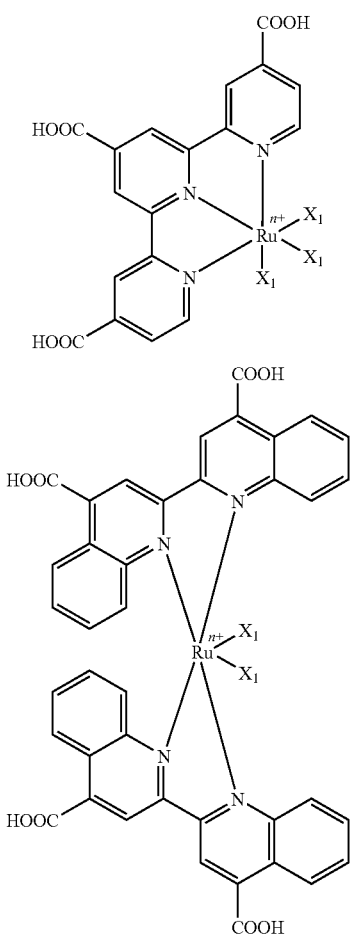

wherein $X_1$ is a univalent anion and each $X_1$ may be independent of each other or cross-linked and are any of those represented by the following formulas:

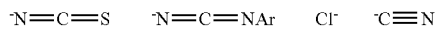

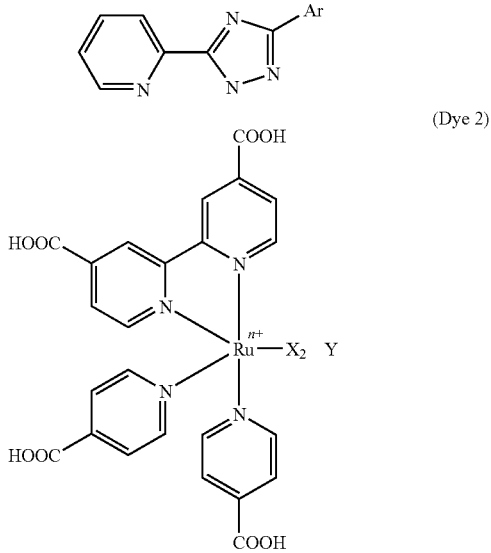
(Dye 2)

-continued

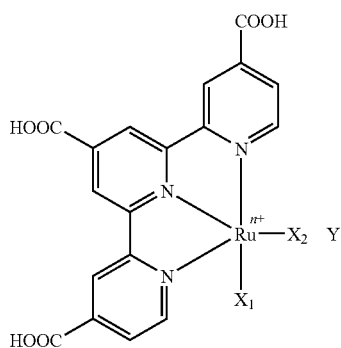

wherein X₁ is the same as that described above and X₂ is a univalent anion and may be any of those represented by the following formulas:

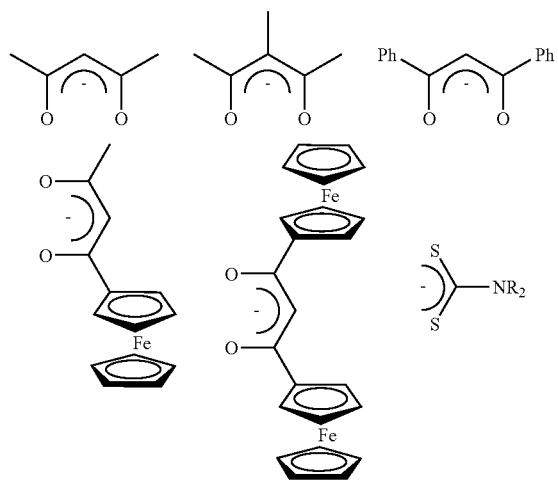

wherein Y is a univalent anion and may be any of halogen ions, SCN⁻, ClO₄⁻, BF₄⁻, CF₃SO₃⁻, (CF₃SO₂)₂N⁻, (C₂F₅SO₂)₂N⁻, PF₆⁻, AsF₆⁻, CH₃COO⁻, CH₃(C₆H₄)SO₃⁻, and (C₂F₅SO₂)₃C⁻;

(Dye 3)

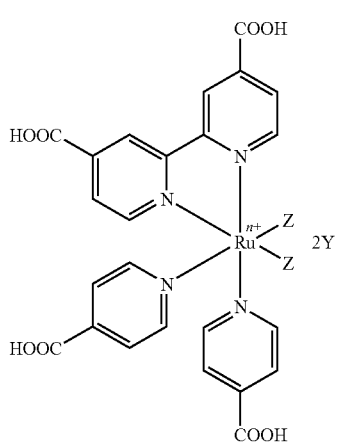

-continued

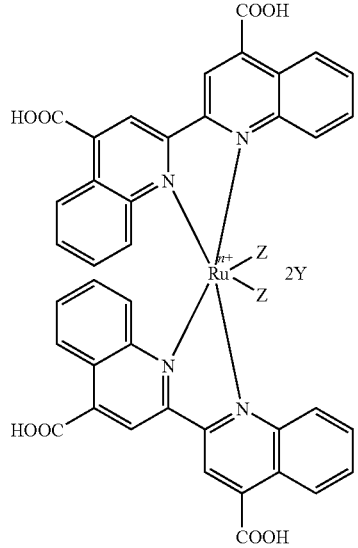

wherein Z is an atomic group having an unshared electron pair, and two Z may be independent of each other or cross-linked and any of those represented by the following formulas:

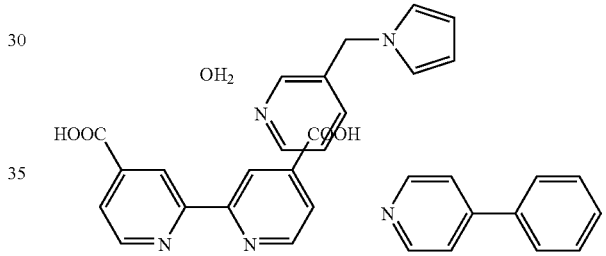

and Y is an univalent anion and may be any of halogen ions, SCN⁻, ClO₄⁻, BF₄⁻, CF₃SO₃⁻, (CF₃SO₂)₂N⁻, (C₂F₅SO₂)₂N⁻, PF₆⁻, AsF₆⁻, CH₃COO⁻, CH₃(C₆H₄)SO₃⁻, and (C₂F₅SO₂)₃C⁻; and (Dye 4)

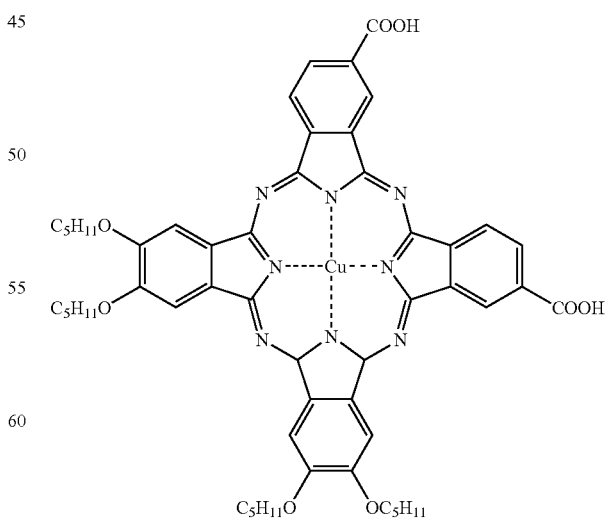

Eligible organic dyes are cyanine-based dyes, hemicyanine-based dyes, merocyanine-based dyes, xanthene-based dyes, triphenylmethane-based dyes, and metal-free phthalocyanine-based dyes. Examples of the dyes used in the present invention include those represented by the following formulas:

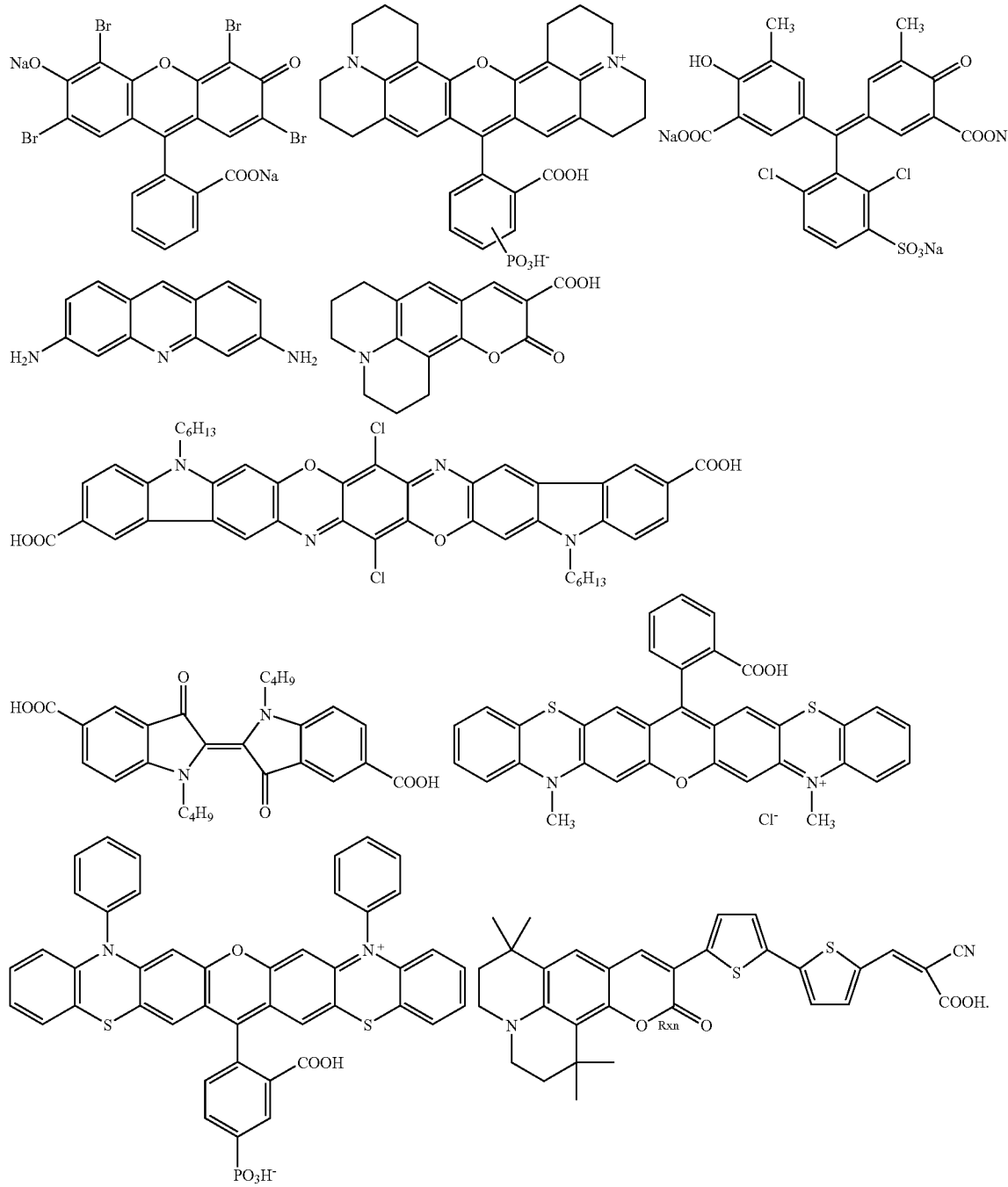

for preferably 10 minutes to 100 hours, more preferably 5 to 50 hours, and particularly preferably 10 to 25 hours. If necessary, the solvent or the semiconductor layer may be heated The dye may be adsorbed to the semiconductor layer by coating thereon a solution obtained by dissolving the dye in a solvent by spray- or spin-coating and drying the solution. In this case, the substrate may be heated to a suitable temperature. Alternatively, the dye may be adsorbed to the semiconductor layer by dipping the layer into the solution. No particular limitation is imposed on the time for dipping as long as the dye is sufficiently adsorbed to the semiconductor layer. However, the semiconductor layer is dipped into the solution or irradiated with supersonic ray before dipping. The concentration of the dye in the solution is from 0.01 to 1000 mmol/L, preferably from 0.1 to 500 mmol/L, and more preferably from 0.5 to 50 mmol/L.

There is no particular restriction on the solvent to be used as long as it dissolves the dye but does not dissolve the semiconductor layer. Examples of the solvent include water, alcohols such as methanol, ethanol, 1-propanol, 2-propanol, 1-butanol, 2-butanol, and t-butanol, nitrile-based solvents such as acetonitrile, propionitrile, methoxypropionitrile, and glutaronitrile, benzene, toluene, o-xylene, m-xylene, p-xylene, pentane, heptane, hexane, cyclohexane, heptane, ketones such as acetone, methyl ethyl ketone, diethyl ketone, and 2-butanone, diethylether, tetrahydrofuran, ethylene carbonate, propylene carbonate, nitromethane, dimethylformamide, dimethylsulfoxide, hexamethylphosphoamide, dimethoxyethane, γ-butyrolactone, γ-valerolactone, sulfolane, adiponitrile, methoxyacetonitrile, dimethylacetoamide, methylpyrrolidinone, dioxolan, trimethyl phosphate, triethyl phosphate, tripropyl phosphate, ethyldimethyl phosphate, tributyl phosphate, tripentyl phosphate, trihexyl phosphate, triheptyl phosphate, trioctyl phosphate, trinonyl phosphate, tridecyl phosphate, tris(trifluoromethyl) phosphate, tris(pentafluoroethyl)phosphate, triphenyl phosphate, and polyethylene glycol. A mixture of any of these solvents may also be used.

There is no particular restriction on the charge transport layer. However, the charge transport layer is preferably a low-molecular weight or polymeric hole transport material or an electrolyte. Examples of the hole transport material include inorganic compounds such as copper iodine and silver iodine and electrically conductive polymeric compounds such as carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted-chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene-based compounds, porphyrin-based compounds, polysilane-based compounds, poly(N-vinylcarbazole) derivatives, aniline-based copolymers, thiophene oligomers and polythiophene.

There is no particular restriction on the electrolyte. Therefore, the electrolyte may be of liquid or solid type and is preferably that exhibiting reversible electrochemical oxidation-reduction characteristics.

The electrolyte is that having anion conductivity of generally $1\times10^{-7}$ S/cm or higher, preferably $1\times10^{-6}$ S/cm or higher, and more preferably $1\times10^{-5}$ S/cm or higher, at room temperatures. The ion conductivity can be sought by a conventional method such as complex impedance method.

The electrolyte used in the present invention are those whose oxidant has a diffusion coefficient of $1\times10^{-9}$ cm$^2$/s or higher, preferably $1\times10^{-8}$ cm$^2$/s or higher, and more preferably $1\times10^{-7}$ cm$^2$/s or higher. The diffusion coefficient is one of the indices indicating ion conductivity and can be sought by any of conventional techniques such as a constant potential current characteristics measurement and a cyclic voltammogram measurement.

There is no particular restriction on the thickness of the electrolyte layer. The thickness is preferably 1 μm or more, more preferably 10 μm or more and preferably 3 mm or less and more preferably 1 mm or less.

There is no particular restriction on the liquid type electrolyte. The electrolyte is usually composed of a solvent, a substance exhibiting reversible electrochemical oxidation-reduction characteristics and dissoluble in the solvent, and if necessary a supporting electrolyte, as essential components.

The solvent may be any solvent as long as it is generally used for electrochemical cells or electric batteries. Specific examples of the solvent include acetic anhydride, methanol, ethanol, tetrahydrofuran, propylene carbonate, nitromethane, acetonitrile, dimethylformamide, dimethylsulfoxide, hexamethylphosphoamide, ethylene carbonate, dimethoxyethane, γ-butyrolactone, γ-valerolactone, sulfolane, propionnitrile, glutaronitrile, adiponitrile, methoxyacetonitrile, methoxypropionitrile, dimethylacetoamide, methylpyrrolidinone, dioxolane, trimethyl phosphate, triethyl phosphate, tripropyl phosphate, ethyldimethyl phosphate, tributyl phosphate, tripentyl phosphate, triheptyl phosphate, trihexyl phosphate, triheptyl phosphate, trioctyl phosphate, trinonyl phosphate, tridecyl phosphate, tris(trifluoromethyl)phosphate, tris(pentafluoroethyl)phosphate, triphenylpolyethylene glycol phosphate, and polyethylene glycol. Particularly preferred examples include propylene carbonate, ethylene carbonate, dimethylsulfoxide, dimethoxyethane, acetonitrile, γ-butyrolactone, sulfolane, dioxolane, dimethylformamide, tetrahydrofuran, adiponitrile, methoxyacetonitrile, methoxypropionitrile, dimethylacetoamide, methylpyrrolidinone, trimethyl phosphate, and triethyl phosphate. Alternatively, an ordinary-temperature melting salt may be used as the electrolyte. The term "ordinary-temperature melting salt" used herein denotes a salt comprising an ion pair in a melted state (liquid state) at ordinary temperature, more specifically a salt comprising an ion pair whose melting point is 20° C. or below and will be in a liquid state at a temperature exceeding 20° C.

Examples of the ordinary-temperature melting salt include those represented by the following formulas:

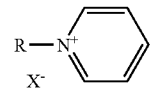

wherein R is an alkyl group having 2 to 20, preferably 2 to 10 carbon atoms and X⁻ is a halogen ion or SCN⁻;

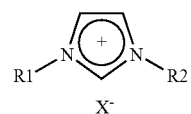

wherein R1 and R2 are each independently an alkyl group having 1 to 10 carbon atoms, preferably methyl or ethyl or an aralkyl group having 7 to 20, preferably 7 to 13 carbon atoms, preferably benzyl and may be the same or different from each other and X⁻ is a halogen ion or SCN⁻;

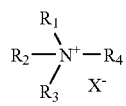

wherein $R_1$, $R_2$, $R_3$, and $R_4$ are each independently an alkyl group having one or more carbon atoms, preferably 1 to 6 carbon atoms, an aryl group having 6 to 12 carbon atoms such as phenyl, or a methoxymethyl group and may be the same or different from each other and X⁻ is a halogen ion or SCN⁻.

Any one or more of the solvents may be used in the present invention.

The substance exhibiting reversible electrochemical oxidation-reduction characteristics is generally referred to as a redox agent. There is no particular restriction on the type of the redox agent. Examples of the substance include ferrocene, p-benzoquinone, 7,7,8,8-tetracyanoquinodimethane, N,N,N',N'-tetramethyl-p-phenylenediamine, tetrathiafulvalene, thianthracene, and p-toluylamine. The substance may also be any of LiI, NaI, KI, CsI, CaI$_2$, iodine salts of quaternary imidazolium, iodine salts of tetraalkylammonium, and metal bromides Br$_2$ such as LiBr, NaBr, KBr, CsBr or CaBr$_2$. Further, the substance may be any of complex salt of Br$_2$ and tetraalkylammoniumbromide, bipyridiniumbromide, bromine salts, or ferrocyanic acid-ferricyanate, sodium polysulfide, alkylthiol-alkyldisulfide, hydroquinone-quinone, and viologen dyes.

The redox agent may be only either one of an oxidant or a reductant or a mixture thereof mixed at a suitable molar ratio. Alternatively, an oxidation-reduction pair may be added such that the electrolyte exhibits electrochemical response properties. Examples of materials exhibiting such properties include metallocenium salts such as ferrocenium having a counter anion selected from halogen ions, SCN$^-$, ClO$_4^-$, BF$_4^-$, CF$_3$SO$_3^-$, (CF$_3$SO$_2$)$_2$N$^-$, (C$_2$F$_5$SO$_2$)$_2$N$^-$, PF$_6^-$, AsF$_6^-$, CH$_3$COO$^-$, CH$_3$(C$_6$H$_4$)SO$_3^-$, and (C$_2$F$_5$SO$_2$)$_3$C$^-$ and halogens such as iodine, bromine, and chlorine.

Examples of substances exhibiting reversible electrochemical oxidation-reduction characteristics include salts having a counter anion (X$^-$) selected from halogen ions and SCN$^-$. Examples of such salts include quaternary ammonium salts such as (CH$_2$)$_4$N$^+$X$^-$, (C$_2$H$_5$)$_4$N$^+$X$^-$, (n-C$_4$H$_9$)$_4$N$^+$X$^-$, and those represented by the following formulas:

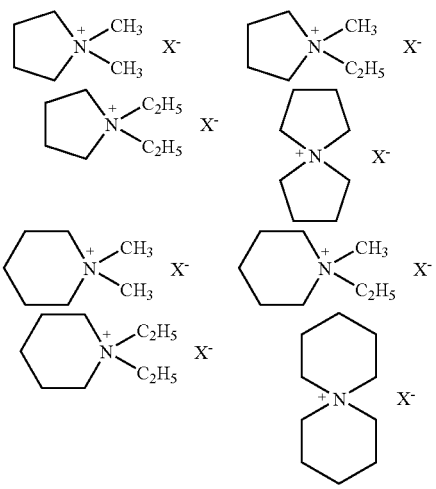

and phosphonium salts such as (CH$_3$)$_4$P$^+$X$^-$, (C$_2$H$_5$)$_4$P$^+$X$^-$, (C$_3$H$_7$)$_4$P$^+$X$^-$, and (C$_4$H$_9$)$_4$P$^+$X$^-$.

Of course, a mixture of these compounds may be suitably used.

Redox ordinary-temperature melting salts may also be used as the substance exhibiting reversible electrochemical oxidation-reduction characteristics. The term "redox ordinary-temperature melting salt" denotes a salt comprising only ion pairs, in a melted state (liquid state) at ordinary temperature, more specifically denotes a salt comprising ion pairs which salt has a melting point of 20° C. or below and will be in a liquid state at a temperature exceeding 20° C. and are capable of inducing a reversible electrochemical oxidation-reduction reaction. In the case of using the redox ordinary-temperature melting salts as the substance exhibiting reversible electrochemical oxidation-reduction characteristics, the above-described solvent may or may not be used.

One or more types of the redox ordinary-temperature melting salts may be used.

Examples of the redox ordinary-temperature melting salt include those represented by the following formulas:

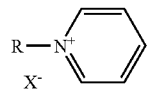

wherein R is an alkyl group having 2 to 20, preferably 2 to 10 carbon atoms and X$^-$ is a halogen ion or SCN$^-$;

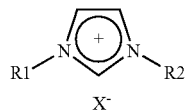

wherein R1 and R2 are each independently an alkyl group having 1 to 10 carbon atoms, preferably methyl or ethyl or an aralkyl group having 7 to 20, preferably 7 to 13 carbon atoms, preferably benzyl and may be the same or different from each other and X$^-$ is a halogen ion or SCN$^-$;

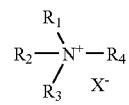

wherein R$_1$, R$_2$, R$_3$, and R$_4$ are each independently an alkyl group having one or more carbon atoms, preferably 1 to 6 carbon atoms, an aryl group having 6 to 12 carbon atoms such as phenyl, or a methoxymethyl group and may be the same or different from each other and X$^-$ is a halogen ion or SCN$^-$.

There is no particular restriction on the amount of the substance exhibiting reversible electrochemical oxidation-reduction characteristics to be used as long as it does not cause any problem such as precipitation in the electrolyte. However, the concentration of the substance in the electrolyte is from 0.001 to 10 mol/L, preferably from 0.01 to 1 mol/L. However, if the redox ordinary-temperature melting salt is solely used, the concentration range is not applied.

The supporting electrolyte to be added if necessary may be salts, acids, alkalis, ordinary-temperature melting salts which have been generally used in the field of electrochemistry or electric batteries.

There is no particular restriction on the salts. For example, the salts may be inorganic ion salts such as alkali metal salts and alkaline earth metal salts, quaternary ammonium salts, cyclic quaternary ammonium salts, and quaternary phosphonium salts. Particularly preferred are Li salts.

Specific examples of the salts include Li, Na, and K salts having a counter anion selected from ClO$_4^-$, BF$_4^-$, CF$_3$SO$_3^-$, (CF$_3$SO$_2$)$_2$N$^-$, (C$_2$F$_5$SO$_2$)$_2$N$^-$, PF$_6^-$, AsF$_6^-$, CH$_3$COO$^-$, CH$_3$(C$_6$H$_4$)SO$_3^-$, and (C$_2$F$_5$SO$_2$)$_3$C$^-$.

The salts may also be any of quaternary ammonium salts having a counter anion selected from ClO$_4^-$, BF$_4^-$, CF$_3$SO$_3^-$, (CF$_3$SO$_2$)$_2$N$^-$, (C$_2$F$_5$SO$_2$)$_2$N$^-$, PF$_6^-$, AsF$_6^-$, CH$_3$COO$^-$, CH$_3$(C$_6$H$_4$)SO$_3^-$, and (C$_2$F$_5$SO$_2$)$_3$C$^-$, more specifically (CH$_3$)$_4$N$^+$BF$_4^-$, (C$_2$H$_5$)$_4$N$^+$BF$_4^-$, (n-C$_4$H$_9$)$_4$N$^+$BF$_4^-$, (C$_2$H$_5$)$_4$N$^+$Br$^-$, (C$_2$H$_5$)$_4$N$^+$ClO$_4^-$, (n-C$_4$H$_9$)$_4$N$^+$ClO$_4^-$, CH$_3$(C$_2$H$_5$)$_3$N$^+$BF$_4^-$, (CH$_3$)$_2$(C$_2$H$_5$)$_2$N$^+$BF$_4^-$, (CH$_3$)$_4$N$^+$SO$_3$CF$_3^-$, (C$_2$H$_5$)$_4$ $N^+SO_3CF_3^-$, $(n\text{-}C_4H_9)_4N^+SO_3CF_3^-$, and those represented by the following formulas:

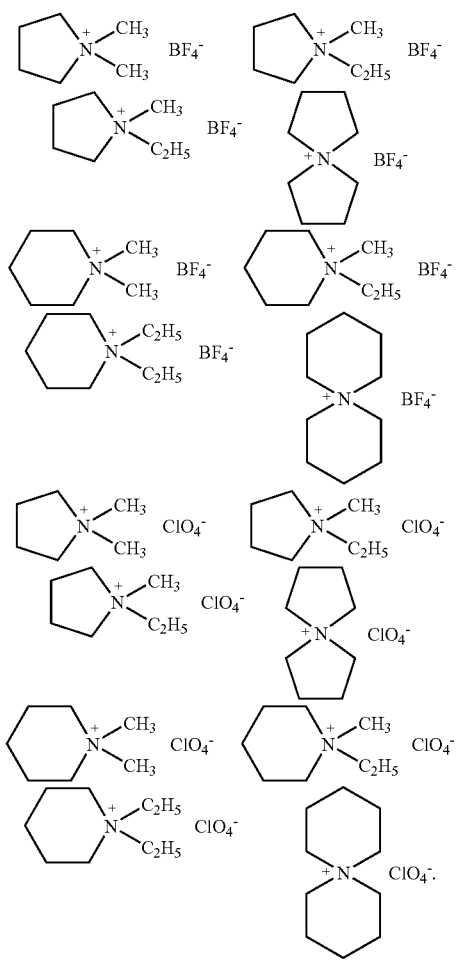

Furthermore, the salts may be any of phosphonium salts having a counter anion selected from $ClO_4^-$, $BF_4^-$, $CF_3SO_3^-$, $(CF_3SO_2)_2N^-$, $(C_2F_5SO_2)_2N^-$, $PF_6^-$, $AsF_6^-$, $CH_3COO^-$, $CH_3(C_6H_4)SO_3^-$, and $(C_2F_3SO_2)_3C^-$. More specific examples include $(CH_3)_4P^+BF_4^-$, $(C_2H_5)_4P^+BF_4^-$, $(C_3H_7)_4P^-BF_4^-$, and $(C_4H_9)_4P^+BF_4^-$.

A mixture of these compounds may be suitably used in the present invention.

There is no particular restriction on the acids, which, therefore, may be inorganic acids or organic acids. Specific examples of the acids are sulfuric acid, hydrochloric acid, phosphoric acids, sulfonic acids, and carboxylic acids.

There is no particular restriction on the alkalis which, therefore, may be sodium hydroxide, potassium hydroxide, and lithium hydroxide.

There is no particular restriction on the amount of the supporting electrolyte which, therefore, may be arbitrarily selected. However, the liquid electrolyte may contain the supporting electrolyte at a concentration of usually from 0.01 to 10 mol/L, preferably 0.05 to 1 mol/L.

The electrolyte may be of the above-described liquid type but is particularly preferably a polymeric solid electrolyte because it may be solidified. Examples of particularly preferred polymeric solid electrolytes include those containing in (a) a polymeric matrix (Component (a)) at least (c) a substance exhibiting reversible electrochemical oxidation-reduction characteristics (Component (c)) and if necessary further containing (b) a plasticizer (Component (b)). In addition to these components, optional components such as (d) any of the above-described supporting electrolyte or (e) ordinary-temperature melting salts may be contained in the polymeric solid electrolyte if necessary. The polymeric solid electrolyte is formed in a solid or gelled state by Component (b) or Components (b) and (c) and/or the additional optional components retained in Component (a), i.e., the polymeric matrix.

There is no particular restriction on materials usable for Component (a), i.e., polymeric matrix as long as they can be formed in a solid or gelled state by themselves or by addition of a plasticizer or a supporting electrolyte or a combination thereof. Polymeric compounds which have been generally used can be used in the present invention.

Examples of polymeric compounds exhibiting characteristics of the polymeric matrix include polymeric compounds obtained by polymerizing or copolymerizing a monomer such as hexafluoropropylene, tetrafluoroethylene, trifluoroethylene, ethylene, propylene, acrylonitrile, vinylidene chloride, acrylic acid, methacrylic acid, maleic acid, maleic anhydride, methylacrylate, ethylacrylate, methylmethacrylate, styrene, and vinylidene fluoride. Any one of these polymeric compounds may be used alone or a mixture of any of these compounds may be used. In the present invention, polyvinylidene fluoride-based polymeric compounds are particularly preferably used.

Examples of the polyvinylidene fluoride-based polymeric compounds include homopolymers of vinylidene fluoride and copolymers of vinylidene fluoride and another polymerizable monomer, preferably a radical polymerizable monomer. Examples of the another polymerizable monomer (hereinafter referred to as "copolymerizable monomer") to be copolymerized with vinylidene fluoride include hexafluoropropylene, tetrafluoroethylene, trifluoroethylene, ethylene, propylene, acrylonitrile, vinylidene chloride, acrylic acid, methacrylic acid, maleic acid, maleic anhydride, methylacrylate, ethylacrylate, methylmethacrylate, and styrene.

These copolymerizable monomers may be used in an amount of 0.1 to 50 percent by mol, preferably 1 to 25 percent by mol, based on the total mass of the monomer.

The copolymerizable monomer is preferably hexafluoropropylene. The polymeric solid electrolyte preferably contains a vinylidene fluoride-hexafluoropropylene copolymer obtained by copolymerizing 1 to 25 percent by mol of hexafluoropropylene with vinylidene fluoride, as the polymeric matrix. A mixture of two or more types of vinylidene fluoride-hexafluoropropylene copolymers with different copolymerization ratios may also be used.

Alternatively, two or more of these copolymerizable monomers may be copolymerized with vinylidene fluoride. For example, copolymers may be used which copolymers are obtained by copolymerizing vinylidene fluoride, hexafluoropropylene and tetrafluoroethylene; vinylidene fluoride, hexafluoropropylene and acrylic acid; vinylidene fluoride, tetrafluoroethylene and ethylene; or vinylidene fluoride, tetrafluoroethylene and propylene.

Furthermore, in the present invention, the polymeric matrix may be a mixture of a polyvinyliden fluoride-based polymeric compound and one or more polymeric compounds selected from the group consisting of polyacrylic acid-based polymeric compounds, polyacrylate-based polymeric compounds, polymethacrylic acid-based polymeric compounds, polymethacrylate-based polymeric compounds, polyacrylonitrile-based polymeric compounds, and polyether-based polymeric compounds. Alternatively, the polymeric matrix may be a mixture of one or more copolymers obtained by copolymerizing a polyvinylidene fluoride-based polymeric compound with two or more monomers of the above-mentioned polymeric compounds. The blend ratio of the homopolymers or copolymers is usually 200 parts by mass or less, based on 100 parts by mass of the polyvinylidene fluoride-based polymeric compound.

In the present invention, preferred polyvinylidene fluoride-based polymeric compounds are those having a weight-average molecular weight of generally from 10,000 to 2,000,000, preferably from 100,000 to 1,000,000.

The plasticizer (Component (b)) acts as a solvent of a substance exhibiting reversible electrochemical oxidation-reduction characteristics. Any type of plasticizers may be used as long as it can be generally used as an electrolyte solvent for electrochemical cells or electric cells. Specific examples include various solvents exemplified with respect to the liquid electrolyte described above. Preferred examples include propylene carbonate, ethylene carbonate, dimethylsulfoxide, dimethoxyethane, acetonitrile, γ-butyrolactone, sulfolane, dioxolan, dimethylformamide, tetrahydrofuran, adiponitrile, methoxyacetonitrile, dimethylacetoamide, methylpyrrolidinone, trimethyl phosphate, and triethyl phosphate. Alternatively, an ordinary-temperature melting salt may be used.

There is no particular restriction on the amount of the plasticizer to be used. The plasticizer may be contained in an amount of 20 percent by mass or more, preferably 50 percent by mass or more, and more preferably 70 percent by mass or more and 98 percent by mass or less, preferably 95 percent by mass or less, and more preferably 90 percent by mass or less, in the polymeric solid electrolyte.

Component (c) is a compound capable of inducing the above-described reversible electrochemical oxidation-reduction reaction and is generally referred to as a redox agent.

No particular limitation is imposed on the type of such a compound. Examples of the compound include ferrocene, p-benzoquinone, 7,7,8,8-tetracyanoquinodimethane, N,N,N',N'-tetramethyl-p-phenylenediamine, tetrathiafulvalene, anthracene, and p-toluylamine. The compound may also be LiI, NaI, KI, CsI, CaI$_2$, iodine salts of quaternary imidazolium, iodine salts of tetraalkylammonium, and metal bromides of Br$_2$ such as LiBr, NaBr, KBr, CsBr or CaBr$_2$.

@Further, the compound may be complex salts of Br$_2$ and tetraalkylammoniumbromide, bipyridiniumbromide, bromine salts, or ferrocyanic acid-ferricyanate, sodium polysulfide, alkylthiol-alkyldisulfide, hydroquinone-quinone, or viologen. The redox agent may be only either one of an oxidant or a reductant or a mixture thereof mixed at a suitable molar ratio.

Particular examples of Component (c) include salts having a counter anion (X$^-$) selected from halogen ions and SCN$^-$. Examples of such salts include quaternary ammonium salts such as $(CH_3)_4N^+X^-$, $(C_2H_5)_4N^+X^-$, $(n-C_4H_9)_4N^+X^-$, and those represented by the following formulas:

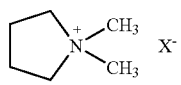 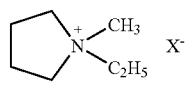

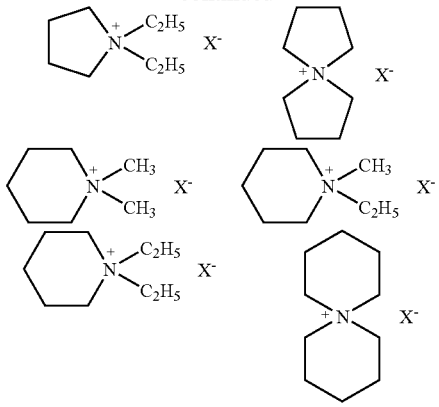

and phosphonium salts such as $(CH_3)_4P^+X^-$, $(C_2H_5)_4P^+X^-$, $(C_3H_7)_4P^+X^-$, and $(C_4H_9)_4P^+X^-$.

Of course, a mixture of these compounds may be suitably used.

These compounds are preferably used in combination with Component (b).

Alternatively, a redox ordinary-temperature melting salt may be used as Component (c). When the redox ordinary-temperature melting salt is used as Component (c), Component (b) may or may not be used in combination.

One type of the redox ordinary-temperature melting salts may be used alone or alternatively two or more types of the salts may be used in the form of a mixture.

There is no particular restriction on the amount of Component (c). Component (c) may be contained in an amount of usually 0.1 percent by mass or more, preferably 1 percent by mass or more, and more preferably 10 percent by mass or more and 70 percent by mass or less, preferably 60 percent by mass or less, more preferably 50 percent by mass or less, in the polymeric solid electrolyte.

When Component (c) is used in combination with Component (b), the mix ratio is desirously selected such that Component (c) is dissolved in Component (b) and does not precipitate after being formed into the polymeric solid electrolyte. The mix ratio by mass of Component (c)/Component (b) is in the range of preferably 0.01 to 0.5 and more preferably 0.03 to 0.3.

The mass ratio of Component (a)/(Components (b) and (c)) is within the range of preferably 1/20 to 1/1, more preferably 1/10 to 1/2.

There is no particular restriction on the amount of the supporting electrolyte (Component (d)) to be used. The supporting electrolyte may be contained in an amount of usually 0.1 percent by mass or more, preferably 1 percent by mass or more, and more preferably 10 percent by mass or more and 70 percent by mass or less, preferably 60 percent by mass or less, and more preferably 50 percent by mass or less, in the polymeric solid electrolyte.

The polymeric solid electrolyte may further contain other components. Examples of other components include ultraviolet adsorbing agents and amine compounds. There is no particular restriction on eligible ultraviolet adsorbing agent. Typical examples of the ultraviolet adsorbing agent include organic ultraviolet adsorbing agents such as compounds having a benzotriazole molecule structure or a benzophenone molecule structure.

Examples of the compound having a benzotriazole molecule structure include those represented by formula (157) below:

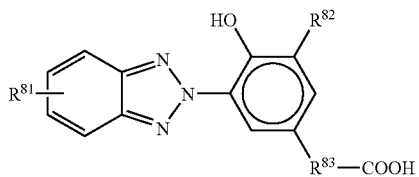

(157)

In formula (157), $R^{81}$ is hydrogen, halogen or an alkyl group having 1 to 10, preferably 1 to 6 carbon atoms. Specific examples of the halogen include fluorine, chlorine, bromine, and iodine. Specific examples of the alkyl group include methyl, ethyl, propyl, i-propyl, butyl, t-butyl and cyclohexyl groups. $R^{81}$ is usually substituted at the 4- or 5-position of the benzotriazole ring but the halogen atom and the alkyl group are usually located at the 4-position. $R^{82}$ is hydrogen or an alkyl group having 1 to 10, preferably 1 to 6 carbon atoms. Examples of the alkyl group include methyl, ethyl, propyl, i-propyl, butyl, t-butyl, and cyclohexyl groups. $R^{83}$ is an alkylene or alkylidene group having 1 to 10, preferably 1 to 3 carbon atoms. Examples of the alkylene group include methylene, ethylene, trimethylene, and propylene groups. Examples of the alkylidene group include ethylidene and propylidene groups.

Specific examples of the compounds represented by formula (157) include 3-(5-chloro-2H-benzotriazole-2-yl)-5-(1,1-dimethylethyl)-4-hydroxy-benzene propanoic acid, 3-(2H-benzotriazole-2-yl)-5-(1,1-dimethylethyl)-4-hydroxy-benzene ethanoic acid, 3-(2H-benzotriazole-2-yl)-4-hydroxybenzene ethanoic acid, 3-(5-methyl-2H-benzotriazole-2-yl)-5-(1-methylethyl)-4-hydroxybenzene propanoic acid, 2-(2'-hydroxy-5'-methylphenyl)benzotriazole, 2-[2'-hydroxy-3',5'-bis(α,α-dimethylbenzyl)phenyl]benzotriazole, 2-(2'-hydroxy-3', 5'-di-t-butylphenyl)benzotriazol, 2-(2'-hydroxy-3'-t-butyl-5'-methylphenyl)-5-chloro benzotriazole, and 3-(5-chloro-2H-benzotriazole-2-yl)-5-(1,1-dimethyl ethyl)-4-hydroxy-benzene propanoic acid octylester.

Specific examples of the compound having a benzophenone molecule structure include those represented by the following formulas:

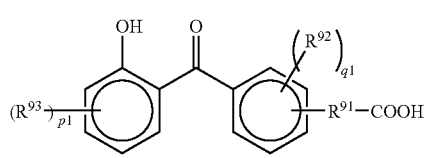

(158)

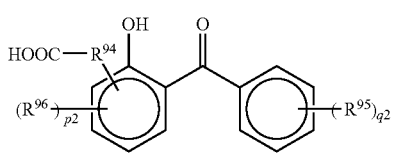

(159)

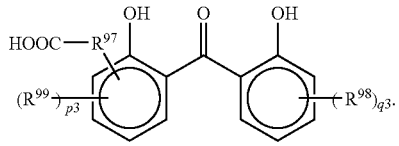

(160)

In formulas (158) to (160), $R^{92}$, $R^{93}$, $R^{95}$, $R^{96}$, $R^{98}$, and $R^{99}$ may be the same or different from each other and are each independently a hydroxyl group or an alkyl or alkoxy group having 1 to 10, preferably 1 to 6 carbon atoms. Examples of the alkyl group include methyl, ethyl, propyl, i-propyl, butyl, t-butyl, and cyclohexyl groups. Specific examples of the alkoxy group are methoxy, ethoxy, propoxy, i-propoxy, and butoxy groups.

$R^{91}$, $R^{94}$, and $R^{97}$ are each independently an alkylene or alkylidene group having 1 to 10, preferably 1 to 3 carbon atoms. Examples of the alkylene group include methylene, ethylene, trimethylene, and propylene groups. Examples of the alkylidene group include ethylidene and propylidene groups.

In the above formulas, p1, p2, p3, q1, q2, and q3 are each independently an integer of 0 to 3.

Preferred examples of the compounds having a benzophenone molecule structure, represented by formulas (158) to (160) include 2-hydroxy-4-methoxybenzophenone-5-carboxylic acid, 2,2'-dihydroxy-4-methoxybenzophenone-5-carboxylic acid, 4-(2-hydroxybenzoyl)-3-hydroxybenzen propanoic acid, 2,4-dihydroxybenzophenone, 2-hydroxy-4-methoxybenzophenone, 2-hydroxy-4-methoxybenzophenone-5-sulfonic acid, 2-hydroxy-4-n-octoxybenzophenone, 2,2'-dihydroxy-4,4'-dimethoxybenzophenone, 2,2',4,4'-tetrahydroxybenzophenone, and 2-hydroxy-4-methoxy-2'-carboxybenzophenone.

Of course, two or more of these ultraviolet absorbing agents may be used in combination.

The use of the ultraviolet absorbing agent is optional. There is no particular restriction on the amount of the ultraviolet absorbing agent to be used. However, if the agent is used, it may be contained in the polymeric solid electrolyte layer in an amount of 0.1 percent by mass or more and preferably 1 percent by mass or more, and 20 percent by mass or less and preferably 10 percent by mass or less.

There is no particular restriction on amine compounds which the polymeric solid electrolyte may contain. Various aliphatic and aromatic amines can be used. Typical examples of the amine compound include pyridine derivatives, bipyridine derivatives, and quinoline derivatives. It is expected that the open-circuit voltage is enhanced by addition of these amine compounds. Specific examples of these compounds include 4-t-butyl-pyridine, quinoline, and isoquinoline.

The polymeric solid electrolyte layer used in the present invention may be produced as an electrolyte film. The method of producing the electrolyte film will be described as follows.

The redox electrolyte film may be obtained by forming a mixture of Components (a) to (c) and optional components to be added if necessary into a film by a conventional method. There is no particular restriction on the film forming method, which, therefore, may be any of extrusion, casting, spin-coating, dip-coating, injection, and impregnation methods.

Extrusion may be conducted in a conventional manner wherein a mixture of the above-described components is formed into a film after being heat-melted.

Casting is conducted by adjusting the viscosity of the mixture by adding thereto a suitable diluent, and coating and drying the diluted mixture with a conventional coater normally used for casting thereby forming the mixture into a film. Examples of the coater include doctor coaters, blade coaters, rod coaters, knife coaters, reverse roll coaters, gravure coaters, spray coaters, and curtain coaters among which a suitable one is selected depending on the viscosity and film thickness.

Spin coating is conducted by adjusting the viscosity of the mixture by adding thereto a suitable diluent, and coating and drying the diluted mixture with a commercially available spin-coater thereby forming the mixture into a film.

Dip coating is conducted by adjusting the viscosity of the mixture by adding thereto a suitable diluent so as to obtain a solution of the mixture, dipping and lifting a suitable substrate therein, and drying the substrate thereby forming the mixture into a film.

Figure 10:
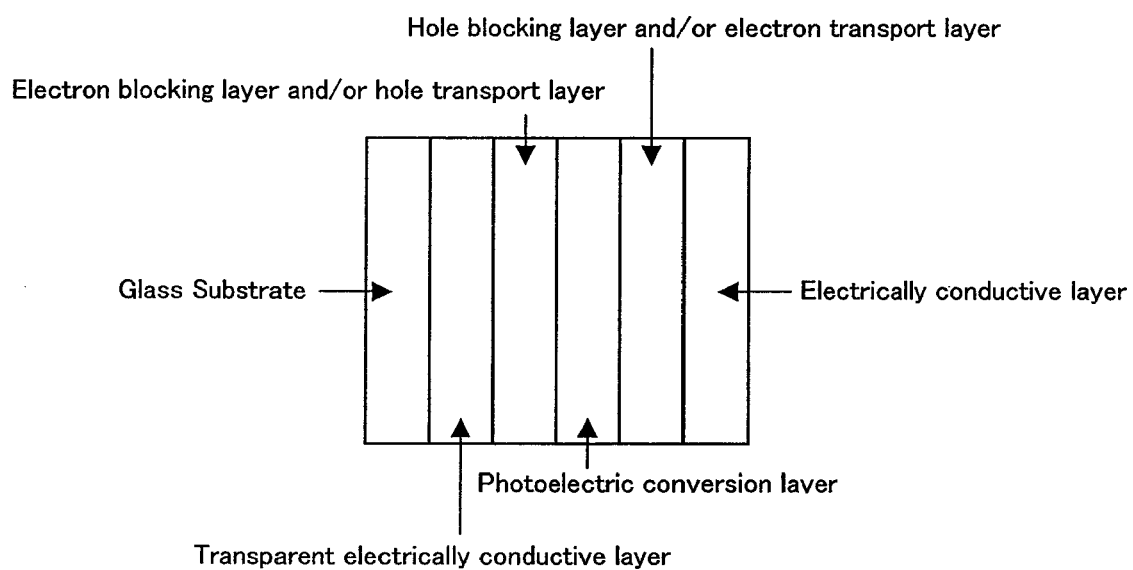
FIG. 10 shows an example of the layer structure of a photoelectric conversion device.

If necessary, the photoelectric converting device of the present invention may be provided with an electron blocking layer and/or a hole transport layer; a hole blocking layer and/or an electron transport layer; or a protection layer. The electron blocking layer and/or the hole transport layer are usually arranged between the anode and the photoelectric converting layer, while the hole blocking layer and/or the electron transport layer are usually arranged between the cathode and the photoelectric converting layer. FIG. 10 shows an example of the layer structure. The term "photoelectric converting layer" used herein denotes a layer generating an electron-hole pair by absorbing light.

Materials for forming the electron blocking layer and the hole transport layer may be any materials as long as they have the function to block photogenerated electrons or the function to transport photogenerated holes. Specific examples of such materials include electrically conductive polymers such as carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted-chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene-based compounds, porphyrin-based compounds, polysilane-based compounds, poly(N-vinylcarbazole) derivatives, aniline-based copolymers, thiophene oligomers, and polythiophene.

The electron blocking layer and/or the hole transport layer may be of a single-layered structure composed of one or more of the materials exemplified above or a multi-layered structure composed of a plurality of layers each having the same or different composition.

The electron blocking layer and/or the hole transport layer may be formed by a method such as vacuum-deposition, LB method, ink jet method, and a coating method wherein any of the above-mentioned materials is dissolved or dispersed in a solvent and then coated by spin-coating, casting, or dip-coating.

When coating is used, a resin component may be dissolved or dispersed together with any of the above materials thereby preparing a coating solution. Eligible resin components are polyvinyl chloride, polycarbonate, polystyrene, polymethylmethacrylate, polybutylmethacrylate, polyester, polysulfone, polyphenyleneoxide, polybutadiene, poly(N-vinylcarbazole), hydrocarbon resins, ketone resins, phenoxy resins, polyamide, ethyl cellulose, polyvinyl acetate, ABS resins, polyurethane, melamine resins, unsaturated polyester resins, alkyd resins, epoxy resins, and silicon resins. There is no particular restriction on the thickness of the electron blocking layer and the hole transport layer. However, the thickness is preferably from 1 nm to 5 µm, more preferably from 5 nm to 1 µm, and particularly preferably from 10 nm to 500 nm.

Materials for forming the hole blocking layer and the electron transport layer may be any materials as long as they have the function to block photogenerated holes or the function to transport photogenerated electrons. Specific examples of such materials include triazole derivatives, oxazole derivatives, oxadiazole derivatives, fluorenone derivatives, anthraquinodimethane derivatives, anthrone derivatives, diphenylquinone derivatives, thiopyrandioxide derivatives, carbodiimide derivatives, fluorenylidene methane derivatives, distyrylpyrazine derivatives, heterocyclic tetracarboxylic anhydrides such as naphthaleneperylene, phthalocyanine derivatives, and metal complexes such as those of 8-quinolinol derivatives and those having metal phthalocyanine, benzoxazole or benzothiazole as a ligand.

The hole blocking layer and/or the electron transport layer may be of a single-layered structure composed of one or more of the materials exemplified above or a multi-layered structure composed of a plurality of layers each having the same or different composition.

The hole blocking layer and/or the electron transport layer may be formed by a method such as vacuum-deposition, LB method, ink jet method, and a coating method wherein any of the above-mentioned materials is dissolved or dispersed in a solvent and then coated by spin-coating, casting, or dip-coating.

When coating is used, a resin component may be dissolved or dispersed with any of the above materials thereby preparing a coating solution. Eligible resin components are the same as those exemplified with respect to the electron blocking layer and/or the hole transport layer. There is no particular restriction on the thickness of the hole blocking layer and/or the electron transport layer. However, the thickness is preferably from 1 nm to 5 µm, more preferably from 5 nm to 1 µm, and particularly preferably from 10 nm to 500 nm.

The protection layer has the function to prevent objects such as moisture and oxygen facilitating deterioration of the device from entering thereinto. Eligible materials for the protection layer are metals such as In, Sn, Pb, Au, Cu, Ag, Al, Ti, and Ni; metal oxides such as MgO, SiO, $SiO_2$, $Al_2O_3$, GeO, NiO, CaO, BaO, $Fe_2O_3$, $Y_2O_3$, and $TiO_2$; metal fluorides such as $MgF_2$, LiF, $AlF_3$, and $CaF_2$; polyethylene; polypropylene, polymethylmethacrylate; polyimide; polyurea; polytetrafluoroethylene; polychlorotrifluoroethylene; polydichlorofluoroethylene; copolymers of chlorotrifluoroethylene and dichlorodifluoroethylene; copolymers obtained by copolymerizing a monomer mixture containing tetrafluoroethylene and at least one type of comonomer; fluorine-containing copolymers having a cyclic structure in the copolymer main chain; water-absorbing substances with an absorptivity of 1 percent or more; and moisture-proof substances with an absorptivity of 0.1 percent or less.

There is no particular restriction on the method of forming the protective layer. Therefore, the protective layer may be formed by any method such as sputtering, reactive sputtering, MBE (molecular beam epitaxy), cluster ion beam, ion plating, plasma polymerization (high-frequency excitation ion plating), plasma CVD, laser CVD, thermal CVD, gas source CVD, coating, and ink jet.

Figure 11:
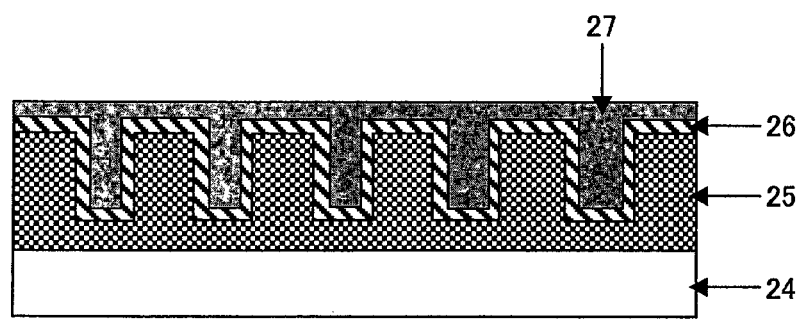
FIG. 11 is a sectional view of a photoelectric conversion device.

FIG. 11 shows an another example of the photoelectric conversion device of the present invention wherein the device has on one surface of the nano-array semiconductor electrode 25 an electrically conductive substrate 24 forming therewith an ohmic junction and on the other surface of the nano-array semiconductor electrode 25 an electrically conductive film 26 forming a Schottky junction therewith and carries a sensitizing dye layer on the electrically conductive film. In the present invention, the semiconductor forming the nano-array semiconductor electrode may be an n-type or p-type semiconductor. The semiconductor may be in any shape such as single crystal, polycrystal or film. For the n-type semiconductor, when its Fermi level is substantially equal to or smaller than the work function of an electrically conductive material, it forms an ohmic junction therewith. When the Fermi level of the n-type semiconductor is larger than the work function of an electrically conductive material, it forms a Schottky junction therewith. For the p-type semiconductor, when its Fermi level is substantially equal to or larger than the work function of an electrically conductive material, it forms an ohmic junction therewith, and when its Fermi level is smaller than the work function of an electrically conductive material, it forms a Schottky junction therewith.

Examples of the n-type oxide semiconductor include titanium oxide, tantalum oxide, niobium oxide, and zirconium oxide but are not limited thereto. When an n-type oxide semiconductor is used as the nano-array semiconductor, a material which is low in work function and forms an ohmic junction with the semiconductor is used as an electrically conductive substrate. For example, when titanium oxide is used as an oxide semiconductor, the electrically conductive substrate may be any electrically conductive film formed of metal such as lithium, sodium, magnesium, aluminum, potassium, calcium, scandium, titanium, vanadium, manganese, zinc, gallium, arsenic, rubidium, strontium, yttrium, zirconium, niobium, silver, cadmium, indium, cesium, barium, lanthanum, hafnium, tantalum, thallium, lead and bismuth; an alloy of any of these metals, a compound containing any of these metals, or a metal oxide of tin or zinc doped with a small amount of a different metal element, such as indium tin oxide (ITO ($In_2O_3$:Sn)), fluorine doped tin oxide (FTO ($SnO_2$:F)) and aluminum doped zinc oxide (AZO (ZnO:Al)) but is not limited thereto.

When an n-type oxide semiconductor is used as the nano-array semiconductor electrode, an electrically conductive material which is large in work function and forms a Schottky junction with the semiconductor is used as an electrically conductive film. For example, when titanium oxide is used as an oxide semiconductor, examples of such an electrically conductive material include, but not limited to, metals such as beryllium, boron, carbon, silicon, chromium, iron, cobalt, nickel, copper, germanium, selenium, molybdenum, ruthenium, rhodium, palladium, antimony, tellurium, tungsten, rhenium, osmium, iridium, platinum, gold and mercury, alloys of these metals and compounds containing any of these metals. The surface resistance of the electrically conductive film is better if it is lower. The surface resistance is preferably 1000 Ω/sq or lower, more preferably 100 Ω/sq or lower.

Examples of methods of forming an electrically conductive film include electrolytic plating, electroless plating, metal deposition such as sputtering, ion-plating and CVD (chemical vapor deposition), a method wherein a metal colloid is adhered on a surface of a semiconductor, a method wherein a paste of coating containing an electrically conductive material is coated and then sintered, a method wherein such a paste of coating is coated and then reduced and sintered, a method wherein a compound containing an electrically conductive material is coated by vapor deposition and then sintered or reduced-sintered, and a method of any combination of the foregoing methods. There is no particular restriction on the thickness of the electrically conductive film thus formed as long as transfer of electrons from the dye layer to the oxide semiconductor layer is not bothered. However, the thickness is preferably from 1 nm to 200 nm, more preferably from 10 nm to 50 nm. The diameter of metal particles contained in a colloid is 100 nm or smaller, preferably 10 nm or smaller. A metal colloid positively charged is likely to well-adhere to an oxide semiconductor. The use of such a colloid makes it possible to easily allow a metal to adhere to an inorganic compound.

Various semiconductors and dyes may be used as the sensitizing dye layer. Here it is important for the sensitizing dye layer that the oxidant-reductant is stable. Furthermore, the electric potential of electrons excited in the light absorption layer and that of holes produced by photoexcitation in the optical absorption layer are also important for the sensitizing dye layer. It is also important that the light absorption edge energy of the sensitizing dye be an energy equal to or more than the energy of a Schottky barrier formed by the semiconductor and the electrically conductive film. More specifically, when the nano-array semiconductor electrode is an n-type semiconductor, it is important that the lowest unoccupied molecular orbital (LUMO) potential of the photoexcited dye and the conduction band potential in the semiconductor be higher than the conduction band potential of the n-type semiconductor and also the potential of holes produced by photoexcitation in the light absorption layer be lower than the Fermi level created after the n-type semiconductor is joined to the electrically conductive film. When the nano-array semiconductor electrode is a p-type semiconductor, it is important that the potential of holes produced by photoexcitation in the light absorption layer be lower than the valence band level of the p-type semiconductor and also the LUMO potential of the photoexcited dye and the conduction band potential in the semiconductor be higher than the Fermi level created after the p-type semiconductor is joined to the electrically conductive film. In order to enhance the photoelectric conversion efficiency, it is also important to lower the probability of recombination of electrons-holes excited in the vicinity of the light absorption layer.

Examples of semiconductors which may be used as the sensitizing dye layer include i-type amorphous semiconductors having a large absorptivity coefficient, direct transition type semiconductors, and particle semiconductors exhibiting a quantum size effect and absorbing visible light efficiently. Examples of dyes which may be used as the sensitizing dye layer include metal complex dyes, organic dyes, and natural dyes. The dye is preferably any of those containing in their molecules a functional group such as carboxyl, hydroxyl, sulfonyl, phosphonyl, carboxyalkyl, hydroxyalkyl, sulfonylalkyl and phosphonylalkyl group. Examples of the metal complex dye include complexes of ruthenium, osmium, iron, cobalt, and zinc, metal phthalocyanines and chlorophyll. Examples of the organic dyes include, but not limited to, cyanine dyes, hemicyanine dyes, merocyanine dyes, xanthene dyes, triphenylmethane dyes, and metal-free phthalocyanines. Generally, one or more of the various semiconductors, one or more of the metal complex dyes and one or more of the organic dyes may be mixed in order to widen the photoelectric conversion wavelength region as much as possible and enhance the photoelectric conversion efficiency. The dyes to be mixed and the ratio thereof may be selected in conformity with the wavelength of the target light source and light intensity distribution thereof.

APPLICABILITY IN THE INDUSTRY

The nano-array electrode of the present invention has a well-controlled or regulated nano-structure and makes it possible to manufacture a device with significantly high conversion efficiency if it is applied in manufacturing a photoelectric conversion device.

BEST MODE FOR CARRYING OUT THE INVENTION

The present invention will be described in more details with reference to the following examples but is not limited thereto.

Example 1

Manufacture of an Anodic-Oxide Porous Alumina Film

An aluminum substrate (purity: 99.99%, manufactured by TOYO ALUMINIUM K.K.) was subjected to constant-current electrolysis at a temperature of 70° C. in a sulfuric acid-phosphoric acid mixed solution (85% 330 mL phosphoric acid, 75 mL concentrated sulfuric acid, 15 mL ethylene glycol, and 80 mL water) for 5 minutes by applying a current of 250 mA/cm$^2$ to the aluminum substrate used as an anode and a black carbon used as a cathode and then washed with water and dried. An anodic oxidization was conducted at a temperature of 16° C. in an aqueous solution containing 0.5 mol/L oxalic acid for 5 hours by applying a voltage of 40 V to the aluminum substrate used as an anode and a black carbon used as a cathode. Thereafter, the aluminum substrate was dipped into a chromic acid-phosphoric acid mixed solution (6 g chromic oxide, 20 g phosphoric acid, and 300 g water) at a temperature of 50° C. for 12 hours and then washed with water and dried. The substrate was further anodically oxidized under the foregoing conditions for one hour. The resulting anodic-oxide porous alumina film substrate was treated in a mercury chloride solution at a temperature of 30° C. for 12 hours so as to remove the aluminum substrate, and then was further treated in an aqueous solution containing 5% phosphoric acid for 40 minutes thereby obtaining a through-hole type anodic-oxide porous alumina film with a film thickness of 8 μm, a hole pitch of 100 nm, and a hole diameter of 75 nm.

[Manufacture of a Nano-Array Electrode]

The resulting through-hole type anodic-oxide porous alumina film was dipped into an aqueous solution containing 0.1 mol/L (NH$_4$)$_2$TiF$_6$ and 0.2 mol/L H$_3$BO$_3$ at a temperature of 30° C. for 5 minutes so as to form a titanium oxide film in its fine pores and then calcined at a temperature of 550° C. for 30 minutes. A 150 nm thickness ITO was formed on one surface of the resulting porous alumina-titanium oxide nano-array by DC magnetron sputtering thereby manufacturing a titanium oxide nano-array electrode.

[Manufacture of a Dye-Sensitizing Type Solar Cell]

The resulting nano-array electrode was dipped into an ethanol solution containing 5.0×10$^{-4}$ mol/L of a ruthenium dye (Rutenium 535-bis TBA manufactured by SOLARONIX SA) for 30 hours and then washed with ethanol and dried so as to allow the dye to be adsorbed. The titanium oxide surface of the resulting substrate was joined to a counter electrode obtained by forming a 3.0 nm thickness film of platinum on the transparent electrically conductive layer of an SnO$_2$:F glass with a surface resistance of 15 Ω/sq (transparent electrically conductive glass wherein an SnO$_2$ film is formed on a glass substrate), and then a 3-methoxypropionitrile solution containing 0.1 mol/L lithium iodide, 0.5 mol/L 1-propyl-2,3-dimethylimidazolium iodide, 0.5 mol/L 4-t-butyl-pyridine, and 0.05 mol/L iodine was allowed to be impregnated by capillary phenomenon. Thereafter, the peripheral was sealed with an epoxy sealant. Lead wires are connected to the ITO electrode and the counter electrode.

A pseudo sunlight was irradiated to the resulting cell so as to determine the current-voltage characteristics. It was confirmed that the cell was 6.5% in photoelectric conversion efficiency and thus exhibited excellent photoelectric conversion characteristics.

Example 2

Manufacture of an Anodic-Oxide Porous Alumina Film

An aluminum substrate (purity: 99.99%, manufactured by TOYO ALUMINIUM K.K.) was subjected to constant-current electrolysis at a temperature of 70° C. in a sulfuric acid-phosphoric acid mixed solution (85% 330 mL phosphoric acid, 75 mL concentrated sulfuric acid, 15 mL ethylene glycol, and 80 mL water) for 5 minutes by applying a current of 250 mA/cm$^2$ to the aluminum substrate used as an anode and a black carbon used as a cathode and then washed with water and dried. An anodic oxidization was conducted at a temperature of 16° C. in an aqueous solution containing 0.5 mol/L oxalic acid for 5 hours by applying a voltage of 40 V to the aluminum substrate used as an anode and a black carbon used as a cathode. Thereafter, the aluminum substrate was dipped into a chromic acid-phosphoric acid mixed solution (6 g chromic oxide, 20 g phosphoric acid, and 300 g water) at a temperature of 50° C. for 12 hours and then washed with water and dried. The substrate was further anodically oxidized under the foregoing conditions for 3 hours. The resulting anodic-oxide porous alumina film substrate was further treated in an aqueous solution containing 5% phosphoric acid for 40 minutes thereby obtaining an anodic-oxide porous alumina film with a film thickness of 24 μm, a hole pitch of 100 nm, and a hole diameter of 75 nm.

[Manufacture of a Nano-Array Electrode]

The resulting anodic-oxide porous alumina film was dipped into an aqueous solution containing 0.1 mol/L (NH$_4$)$_2$TiF$_6$ and 0.2 mol/L H$_3$BO$_3$ at a temperature of 30° C. for 5 minutes so as to form a titanium oxide film in its fine pores and then calcined at a temperature of 550° C. for 30 minutes. Gold was precipitated in the fine pores of the resulting porous alumina-titanium oxide nano-array. A 150 nm thickness ITO was formed on the gold surface of the resulting nano-array by DC magnetron sputtering. Thereafter, the nano-array was dipped into an aqueous solution containing 10% NaOH for 12 hours so as to dissolve the aluminum and alumina.

[Manufacture of a Dye-Sensitizing Type Solar Cell]

The resulting nano-array electrode was dipped into an ethanol solution containing 5.0×10$^{-4}$ mol/L of a ruthenium dye (Rutenium 535-bis TBA manufactured by SOLARONIX SA) for 30 hours and then washed with ethanol and dried so as to allow the dye to be adsorbed. The titanium oxide surface of the resulting substrate was joined to a counter electrode obtained by forming a 3.0 nm thickness film of platinum on the transparent electrically conductive layer of an SnO$_2$:F glass with a surface resistance of 15 Ω/sq (transparent electrically conductive glass wherein an SnO$_2$ film is formed on a glass substrate), and then a 3-methoxypropionitrile solution containing 0.1 mol/L lithium iodide, 0.5 mol/L 1-propyl-2,3-dimethylimidazolium iodide, 0.5 mol/L 4-t-butyl-pyridine, and 0.05 mol/L iodine was allowed to be impregnated by capillary phenomenon. Thereafter, the peripheral was sealed with an epoxy sealant. Lead wires are connected to the ITO electrode and the counter electrode.

A pseudo sunlight was irradiated to the resulting cell so as to determine the current-voltage characteristics. It was confirmed that the cell was 12% in photoelectric conversion efficiency and thus exhibited excellent photoelectric conversion characteristics.

Example 3

Manufacture of an Anodic-Oxide Porous Alumina Film

An aluminum substrate (purity: 99.99%, manufactured by TOYO ALUMINIUM K.K.) was subjected to constant-current electrolysis at a temperature of 70° C. in a sulfuric acid-phosphoric acid mixed solution (85% 330 mL phosphoric acid, 75 mL concentrated sulfuric acid, 15 mL ethylene glycol, and 80 mL water) for 5 minutes by applying a current of 250 mA/cm² to the aluminum substrate used as an anode and a black carbon used as a cathode and then washed with water and dried. An anodic oxidization was conducted at a temperature of 16° C. in an aqueous solution containing 0.3 mol/L sulfuric acid for 8 hours by applying a voltage of 25 V to the aluminum substrate used as an anode and a black carbon used as a cathode. Thereafter, the aluminum substrate was dipped into a chromic acid-phosphoric acid mixed solution (6 g chromic oxide, 20 g phosphoric acid, and 300 g water) at a temperature of 50° C. for 12 hours and then washed with water and dried. The substrate was further anodically oxidized under the foregoing conditions for one hour. The resulting anodic-oxide porous alumina film substrate was further treated in an aqueous solution containing 5% phosphoric acid for 40 minutes thereby obtaining an anodic-oxide highly regulated porous alumina film substrate with a film thickness of 8 μm, a hole pitch of 65 nm, and a hole diameter of 25 nm.

[Manufacture of a Nano-Array Electrode]

The resulting anodic-oxide substrate was dipped into an aqueous solution containing 0.1 mol/L $(NH_4)_2TiF_6$ and 0.2 mol/L $H_3BO_3$ at a temperature of 30° C. for 5 minutes so as to form a titanium oxide film in its fine pores and then calcined at a temperature of 550° C. for 30 minutes. A 150 nm thickness ITO was formed on the titanium oxide film by DC magnetron sputtering. Thereafter, the substrate was dipped into an aqueous solution containing 10% NaOH for 6 hours so as to dissolve the aluminum and alumina film thereby manufacturing a titanium oxide nano-array electrode.

[Manufacture of a Dye-Sensitizing Type Solar Cell]

The resulting nano-array electrode was dipped into an ethanol solution containing $5.0 \times 10^{-4}$ mol/L of a ruthenium dye (Rutenium 535-bis TBA manufactured by SOLARONIX SA) for 30 hours and then washed with ethanol and dried so as to allow the dye to be adsorbed. The titanium oxide surface of the resulting substrate was joined to a counter electrode obtained by forming a 30 nm thickness film of platinum on the transparent electrically conductive layer of an $SnO_2$:F glass with a surface resistance of 15 Ω/sq. (transparent electrically conductive glass wherein an $SnO_2$ film is formed on a glass substrate), and then a 3-methoxypropionitrile solution containing 0.1 mol/L lithium iodide, 0.5 mol/L 1-propyl-2,3-dimethylimidazolium iodide, 0.5 mol/L 4-t-butyl-pyridine, and 0.05 mol/L iodine was allowed to be impregnated by capillary phenomenon. Thereafter, the peripheral was sealed with an epoxy sealant. Lead wires are connected to the ITO electrode and the counter electrode.

A pseudo sunlight was irradiated to the resulting cell so as to determine the current-voltage characteristics. It was confirmed that the cell was 6.3% in photoelectric conversion efficiency and thus exhibited excellent photoelectric conversion characteristics.

Example 4

Manufacture of an Anodic-Oxide Porous Alumina Film

An aluminum substrate (purity: 99.99%, manufactured by TOYO ALUMINIUM K.K.) was subjected to constant-current electrolysis at a temperature of 70° C. in a sulfuric acid-phosphoric acid mixed solution (85% 330 mL phosphoric acid, 75 mL concentrated sulfuric acid, 15 mL ethylene glycol, and 80 mL water) for 5 minutes by applying a current of 250 mA/cm² to the aluminum substrate used as an anode and a black carbon used as a cathode and then washed with water and dried. An anodic oxidization was conducted at a temperature of 16° C. in an aqueous solution containing 0.5 mol/L oxalic acid for 5 hours by applying a voltage of 40 V to the aluminum substrate used as an anode and a black carbon used as a cathode. Thereafter, the aluminum substrate was dipped into a chromic acid-phosphoric acid mixed solution (6 g chromic oxide, 20 g phosphoric acid, and 300 g water) at a temperature of 50° C. for 12 hours and then washed with water and dried. The substrate was further anodically oxidized under the foregoing conditions for one hour. The resulting anodic-oxide substrate was subjected to a treatment for enlarging its pore diameter in an aqueous solution containing 5% phosphoric acid for 40 minutes thereby obtaining an anodic-oxide highly regulated porous alumina film substrate with a film thickness of 6 μm, a hole pitch of 100 nm, and a hole diameter of 75 nm. The substrate was dipped into a mixed solution of methyl methacrylate and benzoyl peroxide and polymerized at a temperature of 40° C. for 12 hours. The resulting alumina-methyl polymethacrylate complex is dipped into an aqueous solution of chromic acid for 8 hours so as to dissolve the alumina thereby manufacturing methyl polymethacrylate nano-arrays.

[Manufacture of a Nano-Array Electrode]

The resulting methyl polymethacrylate nano-arrays were dipped into an aqueous solution containing 0.1 mol/L $(NH_4)_2TiF_6$ and 0.2 mol/L $H_2BO_2$ at a temperature of 30° C. for 5 minutes so as to form a titanium oxide film in the spaces defined between the nano-arrays. Thereafter, the nano-arrays were dipped into acetone so as to dissolve the methyl polymethacrylate and then calcined at a temperature of 550° C. for 30 minutes thereby a titanium oxide nano-array electrode. A 150 nm thickness ITO was formed on one surface of the nano-array electrode by DC magnetron sputtering.

[Manufacture of a Dye-Sensitizing Type Solar Cell]

The resulting nano-array electrode was dipped into an ethanol solution containing $5.0 \times 10^{-4}$ mol/L of a ruthenium dye (Rutenium 535-bis TBA manufactured by SOLARONIX SA) for 30 hours and then washed with ethanol and dried so as to allow the dye to be adsorbed. The titanium oxide surface of the resulting substrate was joined to a counter electrode obtained by forming a 30 nm thickness film of platinum on the transparent electrically conductive layer of an $SnO_2$:F glass with a surface resistance of 15 Ω/sq. (transparent electrically conductive glass wherein an $SnO_2$ film is formed on a glass substrate), and then a 3-methoxypropionitrile solution containing 0.1 mol/L lithium iodide, 0.5 mol/L 1-propyl-2,3-dimethylimidazolium iodide, 0.5 mol/L 4-t-butyl-pyridine, and 0.05 mol/L iodine was allowed to be impregnated by capillary phenomenon. Thereafter, the peripheral was sealed with an epoxy sealant. Lead wires are connected to the ITO electrode and the counter electrode.

A pseudo sunlight was irradiated to the resulting cell so as to determine the current-voltage characteristics. It was confirmed that the cell was 6.5% in photoelectric conversion efficiency and thus exhibited excellent photoelectric conversion characteristics.

Example 5

Manufacture of an Anodic-Oxide Porous Alumina Film

An aluminum substrate (purity: 99.99%, manufactured by TOYO ALUMINIUM K.K.) was subjected to constant-current electrolysis at a temperature of 70° C. in a sulfuric acid-phosphoric acid mixed solution (85% 330 mL phosphoric acid, 75 mL concentrated sulfuric acid, 15 mL ethylene glycol, and 80 mL water) for 5 minutes by applying a current of 250 mA/cm$^2$ to the aluminum substrate used as an anode and a black carbon used as a cathode and then washed with water and dried. An anodic oxidization was conducted at a temperature of 16° C. in an aqueous solution containing 0.5 mol/L oxalic acid for 5 hours by applying a voltage of 40 V to the aluminum substrate used as an anode and a black carbon used as a cathode. Thereafter, the aluminum substrate was dipped into a chromic acid-phosphoric acid mixed solution (6 g chromic oxide, 20 g phosphoric acid, and 300 g water) at a temperature of 50° C. for 12 hours and then washed with water and dried. The substrate was further anodically oxidized under the foregoing conditions for one hour. The resulting anodic-oxide substrate was subjected to a treatment for enlarging its pore diameter in an aqueous solution containing 5% phosphoric acid for 40 minutes thereby obtaining an anodic-oxide highly regulated porous alumina film substrate with a film thickness of 6 μm, a hole pitch of 100 nm, and a hole diameter of 75 nm. The substrate was dipped into a mixed solution of methyl methacrylate and benzoyl peroxide and then polymerized at a temperature of 40° C. for 12 hours. The resulting alumina-methyl polymethacrylate complex is dipped into an aqueous solution of 10% NaOH for 8 hours so as to dissolve the aluminum and alumina thereby manufacturing methyl polymethacrylate nano-arrays.

[Manufacture of a Nano-Array Electrode]

The resulting methyl polymethacrylate nano-arrays were dipped into an aqueous solution containing 0.1 mol/L $(NH_4)_2 TiF_6$ and 0.2 mol/L $H_3BO_3$ at a temperature of 30° C. for 5 minutes so as to form a titanium oxide film in the spaces defined between the nano-arrays.

Thereafter, after a 100 nm thickness indium had been deposited on the titanium oxide film, a 3 μm thickness nickel film was formed on the indium film by electrolytic plating. The resulting nano-arrays with the electrode were dipped into acetone so as to dissolve the methyl polymethacrylate and then calcined at a temperature of 550° C. for 30 minutes thereby manufacturing a titanium oxide nano-array electrode.

[Manufacture of a Dye-Sensitizing Type Solar Cell]

The resulting nano-array electrode was dipped into an ethanol solution containing 5.0×10$^{-4}$ mol/L of a ruthenium dye (Rutenium 535-bis TBA manufactured by SOLARONIX SA) for 30 hours and then washed with ethanol and dried so as to allow the dye to be adsorbed. The titanium oxide surface of the resulting substrate was joined to a counter electrode obtained by forming a 10 nm thickness film of platinum on the transparent electrically conductive layer of an SnO$_2$:F glass with a surface resistance of 15 Ω/sq (transparent electrically conductive glass wherein an SnO$_2$ film is formed on a glass substrate), and then a 3-methoxypropionitrile solution containing 0.1 mol/L lithium iodide, 0.5 mol/L 1-propyl-2,3-dimethylimidazolium iodide, 0.5 mol/L 4-t-butyl-pyridine, and 0.05 mol/L iodine was allowed to be impregnated by capillary phenomenon. Thereafter, the peripheral was sealed with an epoxy sealant. Lead wires are connected to the Ni electrode and the SnO$_2$ electrode.

A pseudo sunlight was irradiated to the resulting cell so as to determine the current-voltage characteristics. It was confirmed that the cell was 6% in photoelectric conversion efficiency and thus exhibited excellent photoelectric conversion characteristics.

Example 6

Manufacture of an Anodic-Oxide Porous Alumina Film

An aluminum substrate (purity: 99.99%, manufactured by TOYO ALUMINIUM K.K.) was subjected to constant-current electrolysis at a temperature of 70° C. in a sulfuric acid-phosphoric acid mixed solution (85% 330 mL phosphoric acid, 75 mL concentrated sulfuric acid, 15 mL ethylene glycol, and 80 mL water) for 5 minutes by applying a current of 250 mA/cm$^2$ to the aluminum substrate used as an anode and a black carbon used as a cathode and then washed with water and dried. An anodic oxidization was conducted at a temperature of 16° C. in an aqueous solution containing 0.5 mol/L oxalic acid for 5 hours by applying a voltage of 40 V to the aluminum substrate used as an anode and a black carbon used as a cathode. Thereafter, the aluminum substrate was dipped into a chromic acid-phosphoric acid mixed solution (6 g chromic oxide, 20 g phosphoric acid, and 300 g water) at a temperature of 50° C. for 12 hours and then washed with water and dried. The substrate was further anodically oxidized under the foregoing conditions for one hour. The resulting anodic-oxide substrate was subjected to a treatment for enlarging its pore diameter in an aqueous solution containing 5% phosphoric acid for 40 minutes thereby obtaining an anodic-oxide highly regulated porous alumina film substrate with a film thickness of 6 μm, a hole pitch of 100 nm, and a hole diameter of 75 nm.

[Manufacture of a Nano-Array Electrode]

The resulting anodic-oxide porous alumina film was dipped into an aqueous solution containing 0.1 mol/L $(NH_4)_2 TiF_6$ and 0.2 mol/L $H_3BO_3$ at a temperature of 30° C. for 40 minutes so as to form a titanium oxide film in its fine pores and then calcined at a temperature of 550° C. for 30 minutes.

Thereafter, after a 150 nm thickness ITO had been formed on the titanium oxide film by DC magnetron sputtering, the film was dipped into an aqueous solution containing 10% NaOH for 12 hours so as to dissolve the aluminum and alumina. A copper iodide film was formed in the fine pores of the titanium oxide nano-arrays by adding dropwise an acetonitrile solution containing 0.5 mol/L of copper iodide from the opposite side of the ITO film surface, heating the titanium oxide nano-array substrate at a temperature of 120° C. A 30 nm thickness film of gold was deposited on the copper iodide film thereby obtaining a solar cell.

A pseudo sunlight was irradiated to the resulting cell so as to determine the current-voltage characteristics. It was confirmed that the cell was 4% in photoelectric conversion efficiency and thus exhibited excellent photoelectric conversion characteristics.

Example 7

Manufacture of an Anodic-Oxide Porous Alumina Film

An aluminum substrate (purity: 99.99%, manufactured by TOYO ALUMINIUM K.K.) was subjected to constant-current electrolysis at a temperature of 70° C. in a sulfuric acid-phosphoric acid mixed solution (85% 330 mL phosphoric acid, 75 mL concentrated sulfuric acid, 15 mL ethylene glycol, and 80 mL water) for 5 minutes by applying a current of 250 mA/cm$^2$ to the aluminum substrate used as an anode and a black carbon used as a cathode and then washed with water and dried. An anodic oxidization was conducted at a temperature of 16° C. in an aqueous solution containing 0.5 mol/L oxalic acid for 5 hours by applying a voltage of 40 V to the aluminum substrate used as an anode and a black carbon used as a cathode. Thereafter, the aluminum substrate was dipped into a chromic acid-phosphoric acid mixed solution (6 g chromic oxide, 20 g phosphoric acid, and 300 g water) at a temperature of 50° C. for 12 hours and then washed with water and dried. The substrate was further anodically oxidized under the foregoing conditions for 10 minutes. The resulting anodic-oxide substrate was subjected to a treatment for enlarging its pore diameter in an aqueous solution containing 5% phosphoric acid for 40 minutes thereby obtaining an anodic-oxide highly regulated porous alumina film substrate with a film thickness of 1 μm, a hole pitch of 100 nm, and a hole diameter of 75 nm.

[Manufacture of a Nano-Array Electrode]

After a film of gold had been formed in the fine pores of the resulting anodic-oxide porous alumina film by electroless plating, the substrate was dipped into a polyphenylene vinylene (PPV) precursor solution at a temperature of 20° C. for 120 hours thereby forming a 20 nm PPV film. Furthermore, the substrate was dipped into a chloroform solution of a fullerene derivative ([6,6]-PCBM) represented by the formula below so as to form a 30 nm thickness [6,6]-PCBM film, and a 150 nm thickness ITO was formed thereon by sputtering.

A pseudo sunlight was irradiated to the resulting cell so as to determine the current-voltage characteristics. It was confirmed that the cell was 2.5% in photoelectric conversion efficiency and thus exhibited excellent photoelectric conversion characteristics.

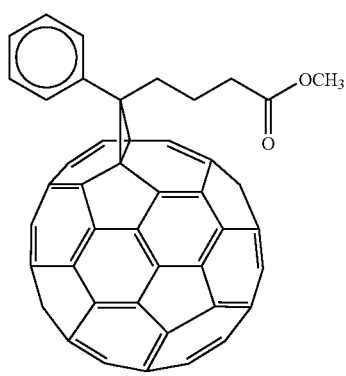

[6,6]-PCBM

Example 8

Manufacture of an Anodic-Oxide Porous Alumina Film

An aluminum substrate (purity: 99.99%, manufactured by TOYO ALUMINIUM K.K.) was subjected to constant-current electrolysis at a temperature of 70° C. in a sulfuric acid-phosphoric acid mixed solution (85% 330 mL phosphoric acid, 75 mL concentrated sulfuric acid, 15 mL ethylene glycol, and 80 mL water) for 5 minutes by applying a current of 250 mA/cm$^2$ to the aluminum substrate used as an anode and a black carbon used as a cathode and then washed with water and dried. An anodic oxidization was conducted at a temperature of 16° C. in an aqueous solution containing 0.5 mol/L oxalic acid for 5 hours by applying a voltage of 40 V to the aluminum substrate used as an anode and a black carbon used as a cathode. Thereafter, the aluminum substrate was dipped into a chromic acid-phosphoric acid mixed solution (6 g chromic oxide, 20 g phosphoric acid, and 300 g water) at a temperature of 50° C. for 12 hours and then washed with water and dried. The substrate was further anodically oxidized under the foregoing conditions for one hour. The resulting anodic-oxide substrate was subjected to a treatment for enlarging its pore diameter in an aqueous solution containing 5% phosphoric acid for 40 minutes thereby obtaining an anodic-oxide highly regulated porous alumina film substrate with a film thickness of 6 μm, a hole pitch of 100 nm, and a hole diameter of 75 nm.

[Manufacture of a Nano-Array Electrode]

After a 150 nm thickness titanium film had been deposited on the resulting anodic-oxide porous alumina film, a 3 μm thickness nickel film was formed on the titanium by electroless plating. The substrate was dipped into a mercury chloride solution at a temperature of 30° C. for 12 hours so as to remove the aluminum substrate and then dipped into an aqueous solution containing 5% phosphoric acid for 40 minutes so as to remove the alumina barrier layer. The resulting substrate with the covered nickel side was dipped into an aqueous solution containing 0.1 mol/L $(NH_4)_2TiF_6$ and 0.2 mol/L $H_3BO_3$ at a temperature of 30° C. for 5 minutes so as to form a titanium oxide film in its fine pores and then calcined at a temperature of 550° C. for 30 minutes thereby manufacturing an titanium oxide nano-array electrode. The nano-array electrode was dipped into an aqueous solution of mercuri chrome and then allowed to stand at room temperature for 15 hours after a film of gold had been formed in the fine pores of the resulting nano-array by electroless plating. As a result, a mercuri chrome sensitizing dye was adsorbed to and coated on the gold formed on the titanium oxide film.

A pseudo sunlight was irradiated to the resulting cell so as to determine the current-voltage characteristics. It was confirmed that the cell was 1.5% in photoelectric conversion efficiency and thus exhibited excellent photoelectric conversion characteristics.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method of fabricating a nano-array electrode wherein after a first organic semiconductor material having an electron-accepting structure or an electron-donating structure is filled into the fine pores of an anodic-oxide porous alumina film obtained by anodically oxidizing aluminum in electrolyte, the spaces defined between the nano-arrays formed of the first organic semiconductor material by removing the anodic-oxide porous alumina film are filled with a second organic semiconductor material having an electron-donating structure if the nano-arrays have an electron-accepting structure and a second organic semiconductor material having an electron-accepting structure if the nano-arrays have an electron-donating structure, wherein a diameter (R) of the pores of the anodic-oxide porous alumina film is 10 times or less than (R≦10 L) an exciton diffusion length (L) of the first organic semiconductor material, and wherein a value (P−R) determined by deducting the diameter (R) of the pores of the anodic-oxide porous alumina film from the pitch (P) between the pores is 10 times or less than (P−R≦10 L') an exciton diffusion length (L') of the second organic semiconductor material.

2. A photoelectric converting device comprising a nano-array electrode manufactured by the method of claim 1.

* * * * *